United States Patent [19]

Kopf

[11] Patent Number: 5,825,830
[45] Date of Patent: Oct. 20, 1998

[54] METHOD AND APPARATUS FOR THE COMPRESSION OF AUDIO, VIDEO OR OTHER DATA

[76] Inventor: David A. Kopf, Rte. 3, Box 347, Pittsboro, N.C. 27312

[21] Appl. No.: 516,383

[22] Filed: Aug. 17, 1995

[51] Int. Cl.⁶ ..................................................... H04B 1/66
[52] U.S. Cl. ............................. 375/340; 341/51; 341/63; 358/261.2; 358/430; 382/239; 382/246; 395/295; 395/114
[58] Field of Search ..................................... 375/240, 253; 370/521; 382/239, 245, 232, 246, 233, 244; 348/404, 384, 421; 358/426, 430, 432, 433, 261.1, 261.2, 427; 386/33, 109; 364/715.02, 951.5, 961.1; 381/106; 341/67, 95, 51, 55, 63; 395/2.91, 2.92, 2.94, 2.95, 114, 888

[56] References Cited

U.S. PATENT DOCUMENTS

| | | | |
|---|---|---|---|
| 4,558,302 | 12/1985 | Welch | 340/347 |
| 4,988,998 | 1/1991 | O'Brien | 341/55 |
| 5,113,494 | 5/1992 | Menendez et al. | 395/163 |
| 5,418,714 | 5/1995 | Sarver | 364/413.13 |
| 5,463,699 | 10/1995 | Wilkinson | 382/246 |
| 5,570,203 | 10/1996 | Suzuki et al. | 358/432 |
| 5,579,413 | 11/1996 | Bjontegaard | 382/248 |
| 5,642,115 | 6/1997 | Chen | 341/67 |

OTHER PUBLICATIONS

Aronson, Data Compression—A comparision of Methods, US Dept. Commerce, Jun. 1977.

Avinash, Image Compression and Data Integrity in Confocal Microscopy, Scanning 17:156–160, 1995.

Wong et al., Radiologic Image compression–A Review, Proc. IEEE, 83:194–219, 1995.

*Primary Examiner*—Chi H. Pham
*Assistant Examiner*—William Luther
*Attorney, Agent, or Firm*—Lynn E. Barber

[57] ABSTRACT

A data compression method utilizing a series of rules which are chosen for best compressing selected data. Rules are provided for converting each datum into a binary value, and encoding this binary value into a variable-width bit field. Rules are provided for automatically increasing or decreasing the binary field width which encodes the next data value, based on the current field width and encoded data value. An escape code is used to increase the field width for the next encoded value. A rule for efficient run-length encoding of repeated values or codes may also be included.

20 Claims, 12 Drawing Sheets

General Variable-bit-field DAX Encoder

FIG. 1  DIAGRAMMATIC RELATIONSHIP OF TERMS

Flowchart for DAX-MGHL Decoder

METHOD AND APPARATUS FOR THE COMPRESSION OF AUDIO, VIDEO OR OTHER DATA

BACKGROUND OF THE INVENTION

1. Field of the Invention

This invention relates to methods for compressing digital data, for example, audio, video or text data.

2. Description of the Related Art

Data compression methods are used to encode digital data into an alternative, compressed form having fewer bits than the original data, and then to decode (decompress) the compressed form when the original data is desired. The compression ratio of a particular data compression system is the ratio of the size (during storage or transmission) of the encoded output data to the size of the original data. Such methods are increasingly required as the amount of data being obtained, transmitted, and stored in digital form increases substantially in many diverse fields, for example, the fields of medical imaging, audio recording, photography, telecommunications, and information retrieval. Many different data compression techniques have been developed with the goal of reducing the total cost of transmitting and storing the data, which for transmission, is due to the cost of operating the transmission channel, and for storage, is due both to the cost of storage media such as disks, and the cost of transferring data to storage devices.

There is a particular need for data compression in the fields of radiologic imaging, pathology (both anatomic and laboratory medicine), and telemedicine (the interactive transmission of medical images and data to provide patients in remote areas with better care). As discussed by Wong et al. ("Radiologic Image Compression—A Review", Proc. IEEE 83: 194–219, 1995), major imaging modalities such as computed tomography (CT), magnetic resonance imaging (MRI), ultrasonography (US), positron emission tomography (PET), nuclear medicine (NM), digital subtraction angiography and digital fluorography are used to acquire patient images in digital form. The disclosure of this publication and all other publications and patents referred to herein is incorporated herein by reference. Many types of medical imaging, such as conventional X-rays, while not initially taken in digital form are often converted into digital form using laser scanners, solid-state cameras, and video cameras. The digital image form allows easy image transfer and archiving, but takes a substantial amount of transmission time and storage space unless it is compressed.

Generally, data compression techniques can be categorized as either "lossless" (reversible compression which may only achieve modest compression but allows exact recovery of the original image from the compressed data), or "lossy" (irreversible compression which does not allow exact recovery after compression but potentially can achieve much higher levels of compression). In some fields, exact recovery may not be necessary, for example, audio data where one only wants to have a record of what was said, and does not need to have an accurate rendition of the sound. In other fields, such as in medical imaging used for diagnostic purposes, it may be essential, and possibly federally mandated, that there be no loss in the data, i.e., no loss of information which may be needed for making the diagnosis.

Data which contain redundancy (frequent repetition of symbols or patterns of symbols) are particularly amenable to data compression by means of dictionaries. "Dictionary techniques" may be defined as techniques which factorize common substrings (see Williams, Ross N., *Adaptive Data Compression*, Kluwer Academic Publishers, 1991, at page 22).

Early data compression techniques were reviewed by Jules Aronson (*Computer Science & Technology: Data Compression—A Comparison of Methods*, US Department of Commerce, National Bureau of Standards Special Publication 500-12, June 1977). These techniques include null suppression techniques which take advantage of the fact that many types of data include large numbers of zeros, blanks or both, and may utilize, for example, a bit map or the run length technique. The latter technique utilizes a special character to indicate a run of zeros and a number to indicate how may zeros there are.

Data compression techniques also include pattern substitution in which a chosen character may represent a repeating pattern in the data, statistical encoding which takes advantage of the frequency distribution of characters so that frequent characters are represented by the shorter codes, and telemetry compression in which fields are encoded with the incremental difference between the field and the preceding field so long as that difference is under some predetermined value.

A variant of the latter is adaptive delta modulation, in which an "escape" code is used to indicate a gain change in the difference magnitude; this allows an arbitrarily large change in signal to be encoded in a fixed number of bits (See, for example, Abate, J. E., "Linear and Adaptive Delta Modulation", Proc. IEEE 55(3):298–308, 1967).

Traditional lossless encoding methods map frequently-used values or sequences of values into shorter-length output codes, either through tables stored with the compressed data or tables built up from the encoded data stream itself. Arithmetic methods achieve compressions near the theoretical maximum in terms of mathematical information content or "entropy" of the input data, but do not directly take advantage of any additional properties of the input data. Although when data is slowly varying, a forward difference transformation as is known in the art can reduce the mathematical entropy and lead to better compression, problems arise when there are occasional large differences between successive data values. If these large values are to be generally accommodated, the increase in compression is often small.

The Huffman Code (Huffman, D., "A Method for the Construction of Minimum Redundancy Codes", Proc. I.R.E. 1962, pages 1098–1101) is an "optimal" binary code that is lossless and widely used. An "optimal" code is defined by Aronson as a code which is uniquely decipherable and minimizes the average code-word length for the entire message. A code is "uniquely decipherable" if every finite sequence of code characters corresponds to at most one message. The degree of "optimality" of a code is measured by the ratio of the entropy of the message or text to the entropy of the source, which may be defined as the logarithm of the number of possible messages that a data source can send over a unit of time (using log base 2, the unit of entropy is the "bit"). In the Huffman Code, commonly used long strings of data are replaced by variable length indices into a dictionary. The dictionary may be a standard dictionary suitable for the data most often sent (e.g., telefax transmission), or may be tailored to particular data by being completely specified by mathematical transformations on the data to be encoded.

Another lossless compression method, the Lempel-Ziv and Welch (LZW) method, uses the same dictionary built by the encoder and decoder following the same rules on the data stream as it is passed. The dictionary adapts to the characteristics of the data. This method is useful for text and graphic data compression, since it relies on repeating sequences for compression; however, noisy data does not compress well with this method.

More specifically, the patent of Welch (U.S. Pat. No. 4,558,302) for a high speed data compression and decompression apparatus and method which compresses an input stream of data character signals by storing strings of data character signals encountered in the input stream in a table. The input stream is searched to determine the longest match to a stored string. Each stored string comprises a prefix string and an extension character (the last character of the string). Each string has a code signal by which it is stored. The code signal for the longest match between the input data character stream and the stored strings is transmitted as the compressed code signal and an extension string is stored in the string table. The extension character is the next input data character signal following the longest match. The encoder and decoder follow the same rules to construct the string tables so that they do not have to be sent separately. As the tables become longer and more complex, increasing amounts of processing and table storage are required. High speed encoding and decoding can thus be quite expensive.

JPEG (Joint Photographic Experts Group) compression is an industry standard for storage or transmission of digital images. JPEG uses a discrete cosine transform (DCT)-based lossy compression which is achieved by disregarding high-frequency components since most of the information is in lower spatial frequencies. JPEG specifies two entropy coding methods for the spatial frequency information— Huffman coding and arithmetic coding (Pennebaker, W. B., "JPEG Technical Specification", ISO/IEC JTC1/SC2/WG JPEG-8-R8, 1990, and Wallace, G. K., "The JPEG Still Picture Compression Standard", Comm. ACM 34: 31–45, 1991).

Techniques for compressing motion picture data include various MPEG standards, named for the Motion Pictures Expert Group, a joint committee of the International Organization for Standardization and the International Electrotechnical Commission, which began to be introduced in the early 1990's. These standards address both the audio and visual sides of audiovisual programming and therefore includes both audio and video compression and decompression. These MPEG techniques are lossy and therefore generally give a reduced quality. One such method relies both on interframe compression, in which background information is stored, and then only changed new information is retained, and on the JPEG algorithm for individual intraframe compression.

Modern predictor techniques have been in use since the early 1980's. They are based on complex decision trees which are constructed for each type of data being encoded. See the articles on the Q-Coder and VLSI chip, by Pennebaker et al., Mitchell et al., and Arps et al. in IBM J. of Research and Development 32(6):716–795, 1988. As compression algorithms become more complex, the amount of computation power required for the encoder and decoder becomes increasingly important. See Krichevsky, R., *Universal Compression and Retrieval*, Kluwer Academic Publishers, 1994, particularly Appendix 2.

As a general rule, existing compression methods do not compress short runs of data as well as longer runs. Algorithms which are efficient for a few tens of bytes are more suitable for the compression of individual packets in data transmission networks.

It is therefore an object of this invention to provide a method for compressing data (and for decompressing the compressed data) which may be easily adapted and is efficient in compressing different types of data, can be operated at high speeds at a small cost, and is suitable for both short and long runs of data.

It is a further object of this invention to provide a data compression method which is lossless.

Other objects and advantages will be more fully apparent from the following disclosure and appended claims.

SUMMARY OF THE INVENTION

The data compression method of the invention utilizes a series of rules which are chosen for best compressing the type of data in question. In all cases, there are rules for converting each datum into a binary value, and encoding this binary value into a variable-width bit field channel code. In addition, there are rules for automatically increasing or decreasing the binary field width which encodes the next channel code, based on the current field width and binary value. Since the same rules are followed by both encoder and decoder, the explicit field width for each code is usually not required to be sent, and the field width will continuously and automatically adapt to the characteristics of the data being compressed. The lossless compression method of the invention is useful for many kinds of digital data, particularly those with locally small differences between successive binary values relative to the overall data range. Compression ratios are often lower than for existing lossless or high-quality compression schemes.

Other aspects and features of the invention will be more fully apparent from the following disclosure and appended claims.

DETAILED DESCRIPTION OF THE INVENTION AND PREFERRED EMBODIMENTS THEREOF

Utilizing variable-bit-field encoding, the invention herein provides a compression/decompression scheme in which there is dynamic variation of the code length based on the length of the code for the current input value and on the current input value itself. The compression scheme discussed herein has been given the name "Differential Adaptive Compression" or DAX. The invention works particularly well with slowly varying spectra or images with a large overall dynamic range. Even graphs characterized by sharp edges and large areas of constant value are efficiently compressed with slight modification of the basic invention.

The basic concept behind the present invention is that rules are provided for automatically increasing or decreasing the binary field width used to encode the next input value, based on the current field width and on values which have already been sent. Both encoder and decoder follow the same rules, which may be implemented in computer software using a digital processor or in dedicated electronic devices. As used herein, a "digital processor" is a computer or other device that can receive, manipulate, transmit and/or store digital data.

Figure 1:
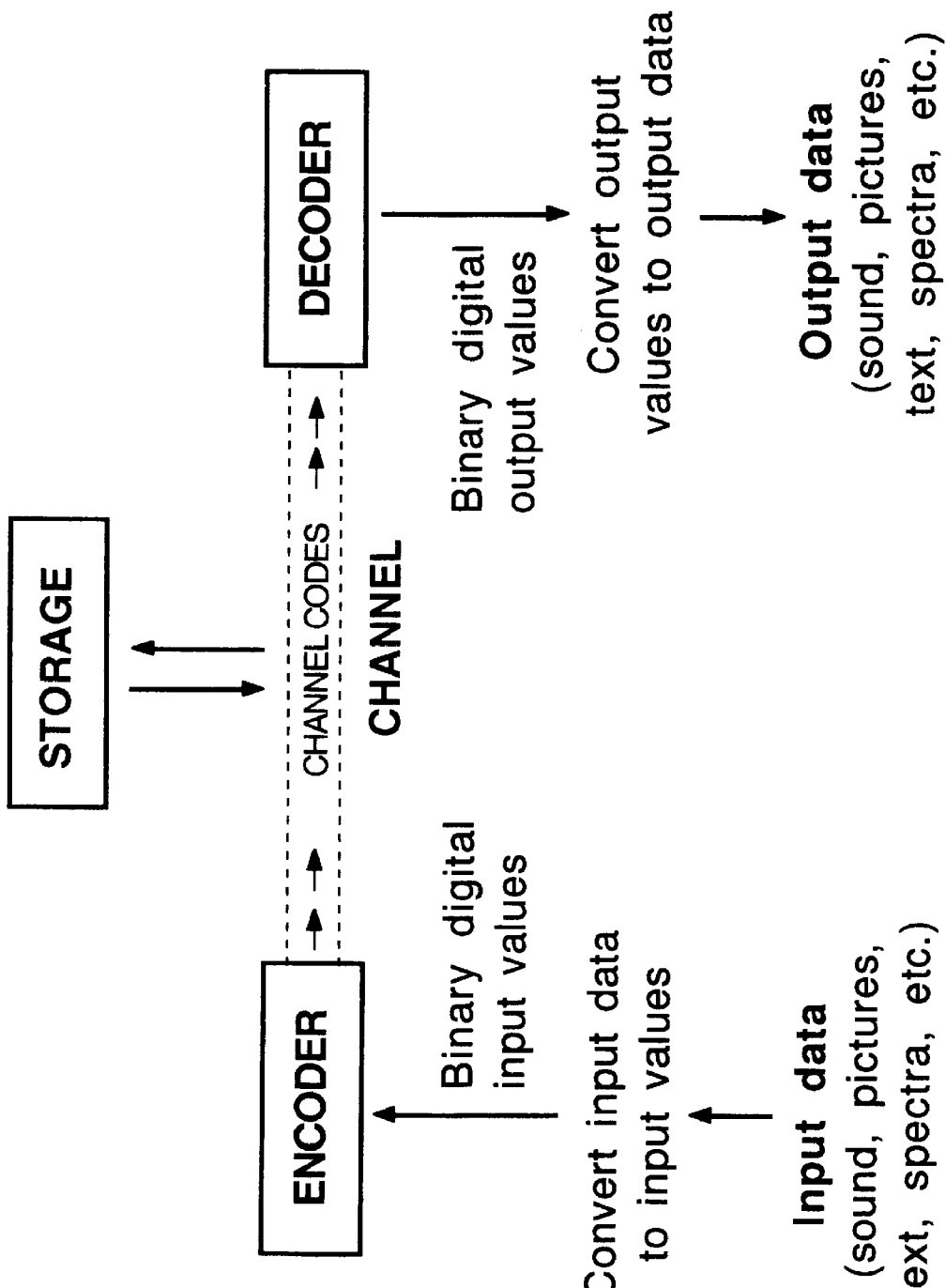
FIG. 1 is a schematic diagram of the method of the invention, to clarify the terms used herein.

A schematic diagram of the invention is shown in FIG. 1. As used herein, the term "input data" refers to the data which is to be compressed, which may be sound, pictures, spectra or other data, in digital or analog, form. An "input value" is the binary digital data obtained from the input data. Each "channel code" is the variable bit field code into which the input values are encoded in the invention. The channel codes may be stored and/or transmitted to a decoder, where they are decoded into binary digital "output values" that correspond to the input values, and then to "output data" which is identical to the input data when the invention is used in its preferred lossless form. The term "field width" refers to the length of the code "word" (the number of binary digits in the channel code for a particular input value).

As used herein, maximum field width M means the maximum number of bits required to contain the input (or output) data values. If arithmetic transformations such as forward difference are performed to generate the data values, such arithmetic can be performed modulo "M" so that only the lower M bits of the data values need to be encoded. "Granularity" means the noisiness of the data or the bit-field width required to contain the most common forward difference of the input values. A granularity of G means that the absolute value of typical differences between successive data values is less than $2^{G-1}$. "Hysteresis", H, is a useful variable where the data is digitized speech or certain images such as graphics, in which a burst of large data values occurs before settling down to the usual baseline values. A "hysteresis counter", $H_c$, may be used to prevent the usual automatic decrease in field width during this period, which would otherwise require excessive escape codes to maintain the required field width. An "escape code" is a selected code which is used to indicate that a particular input value does not fit into the current field width, and the field width is to be incremented a predesignated amount.

Although in its preferred embodiments, the invention provides lossless decompression, the invention may be modified to allow for "loss". The data values can be right shifted L bits before encoding, and left shifted L bits after decoding. In this case, the arithmetic need only be performed modulo: M-L bits; however, loss is not an inherent part of the invention herein. Loss may be desirable when channel capacity would otherwise be exceeded or signal to noise needs to be increased.

The invention herein may be used to compress analog or digital data. Any data which is not in digital binary form is converted to digital binary form prior to compression, which may be done using techniques known in the art. In addition, the input data already in digital form may be preliminarily transformed depending on the type of data. Thus, in using the invention, the initial data values which are compressed may themselves be the result of one or more prior compression methods, including any known in the art such as Huffman coding, MPEG, and the like.

Multicomponent data may also undergo preliminary treatment to generate the input values. For example, red-green-blue data for the channels may be combined (e.g., encoded as green, green minus red, and green minus blue). For stereo channel data, the sum and difference of the left and right channels may be used. Such mixtures may result in more efficient encoding through the combination of the channels as compared to encoding each channel separately. Projection onto principal component channels before encoding will in general result in larger compression factors for channels with small variance. Further, a useful increase in lossy compression may be realized by discarding, introducing loss, or modelling the information contained in the smaller variance channels. Principal component analysis is discussed in detail in Clarke, R. J., "Transform Coding of Images", Academic Press, 1985, page 95ff.

In addition to preliminary lossless treatment of the data, if it is not necessary to have lossless compression, the data points themselves may be altered slightly, for example, by switching two adjacent points to reduce the difference between successive values in a series, by incrementing or decrementing the data slightly to reduce variance and reduce the need for escape codes, and by other preprocessing or preordering steps prior to compression according to the invention.

Within the rules discussed below, there are certain rules which are essential for the invention, other rules that are preferably included but not absolutely necessary for all types of data, and other rules that are optional, but have certain benefits particularly for some types of data. Briefly, the rules related to (a) establishment and use of an escape code (or field width increase code) and (b) automatic adjustment of field width are essential. The rule related to rapid field increase is strongly preferred to optimize compression efficiency. The remaining rules are optional, but for use of the method in the optimum way for different types of data, as many of the rules as possible are included.

In the essential embodiment, compression is achieved because the explicit field width for each code is usually not required to be sent, and the field width will continuously and automatically adapt to the characteristics of the data being compressed. In the preferred embodiments, the invention is further defined by the use of a rapid field expansion technique and a repeat code. Additional rules allow more efficient compression of the data and may be utilized as appropriate for the type of data being compressed.

The simplest form of forward difference variable-bit-field compression discards all sign-extension bits from the input values, and packs the resulting binary values into the channel codes as tightly as possible. In twos complement notation, a binary field W+1 bits wide can only represent the integers from $-2^w$ to $2^{w-1}$. Some rules therefore are required to vary the field width W to track the magnitude of the values.

A first basic rule of the invention is to set the initial field width W, for example, W=2 bits. If forward differencing is being used, the data sample prior to the first data sample is specified, for example, as 0.

In an additional rule, an escape code is determined. For example, the binary string representing $-2^{W-1}$ (1 followed by W-1 zeroes) is reserved for an "escape code". If the next input value does not fit into the current field width, the escape code is output and the field width is incremented by a number, for example, by 1.

To allow reduction in the size of the field width, the field width is preferably decremented by a number, for example, by 1, if the current input value would have fit into a smaller field. To allow increase in the size of the field width, the width is incremented if the current value required the full field.

The setting of the initial field width and previous value, and the codes to increment or decrement the field width require very little CPU time and work quite well for smoothly-varying data streams from scanners, spectrometers, or sound digitizers. Additional rules set forth below have been found to give even higher compression ratios and applicability to a broader range of data.

If the maximum field width is known by both the encoder and decoder, an additional bit can be saved to encode the value, $-2^{M-1}$, which would normally be the escape code to go to a field width of M+1. In this case, the escape code is treated as the value, and the field width stays at the maximum width.

The basic rules can be modified to obtain greater compression by never allowing the field width W to fall below the granularity G. The rule for decrementing the field length could be modified so that if particular codes are output, the field width immediately is reduced to the granularity of the data: after a repeat count, the field width could be immediately changed to the granularity. Noisy data, graphics or images for which the pixel value indexes into a color table often compress better by using a higher granularity. The optimum G is found by compressing the first few thousand data values with different granularity. The compressed size typically falls until the optimum granularity is reached, then rapidly rises. The granularity can be stored along with the compressed record, or encoded into the output data stream under a rule encoding parameter changes as discussed herein. If the granularity is set to the maximum field width M (discussed above), no compression is done, and the encoded values are always passed in full field width. Using this embodiment, the worst-case compression ratio is very close to one (1).

An additional rule for hysteresis is useful if the data is such that frequent use of the escape code is necessary to increment the field width, for example, when there are alternating large and small values in the data stream. A convention can be adopted, for example, that when an escape code is output, the field width will not be decremented for the next H values, where H is the current hysteresis. It can be seen that the default rules where no hysteresis is specified, specifies a hysteresis as 0. Setting H to 1 removes the escape codes when there are alternating large and small codes in the data stream. Values of H up to 15 or so are useful for audio and speech compression. The hysteresis can be stored with the granularity.

A convenient variable loss factor is permitted by right-shifting the data before input to the encoder (dividing by powers of two) with a corresponding left-shift of the decoder output. This requires very little additional processing complexity and is easily implemented in a hardware device by means known in the art. Since this is a form of truncation, the average value of the decoded data stream will fall unless the input data is randomly dithered by half the loss factor (the most accurate solution) or the output data is biased by half the loss factor (the fastest solution). The output bit size and loss factor together determine the maximum field width and modulus for modulo differences.

It is recognized that the loss factor can be raised if necessary to temporarily reduce the length of binary codes sent through the channel, if lossless transmission of the information would exceed the maximum channel capacity, or if the channel signal-to-noise ratio needs to be temporarily increased without changing the average power transmitted through the channel.

When the encoded values (channel codes) require an abrupt large increase in bit field length, which would require three or more escape codes to effect the increase, it is convenient to use an alternate mechanism, termed herein "fast field increase", which uses fewer codes to specify the increase. An inherent property of the stream of encoded values (channel codes) can be exploited to provide for such increase. The value immediately following each escape code would ordinarily be either another escape code, or a channel code which required the increased field length. The rule can optionally be adopted that if the encoded value following an escape code does not require the increased field length, it is not a data value but rather indicates a field length increment. To encode this increment in the fewest number of bits, it is biased by 1 (since an increment of 1 would be accomplished in the same number of bits through the use of another escape code), and also by the most negative value encodable in the previous field length. For example, since the three signed integers 111, 000, and 001 could also be encoded in two bits, they represent field length increments of 2, 3 and 4 when following an escape code with a current field length of 2. To go from a field length of 2 to 7, therefore, the codes 10 001 are output.

When the input data contains runs of identical data values, additional compression may often be achieved through the encoding of values using a repeat count. Alternatively, or additionally, repeated codes may be eliminated using a repeat count. Thus, in a preferred embodiment, a repeat count less than or equal to $2^R$ values is encoded in R+1 bits, where the first bit is always 1. The bit field length R is passed as the number of binary zeroes following the first repeated channel code. Thus, if there are no additional repeats, a single binary 1 is encoded after the repeated value; one additional repeat as the binary string 010, two additional repeats as 011, three additional repeats as 00100, etc. Other embodiments might encode the repeat count in fixed numbers of bits following each first repeat, in variable numbers of bits following particular codes reserved for this purpose, or specify repeat counts for both input values and channel codes. Also, it should be noted that the data value following a repeat count should not be another repeat, otherwise it would have been included in the repeat. A comprehensive survey of prior survey repeat count encoding methods is found in Tanaka, H. and Leon-Garcia, A., "Efficient Run-Length Encodings", IEEE Transactions on Information Theory 28(6):880–890, 1982.

Encoding rules for parameter changes are also a useful optional part of the invention to change the characteristics of the data. A "nonsensical" code length change can be used for this purpose. In light of the faster field expansion discussed above, the sequence: escape, 0, escape, would not normally be generated in the encoded output. This sequence can signal that new encoding rules and parameters will follow in some predetermined format. Other nonsensical code length sequences can be used for other purposes, for example, a repeat count following a repeat as discussed above. A nonsensical code could also provide information on "context switching", e.g., that the type of data is being changed, for example from video to audio and back, and therefore the compression rules are to change, or the data is not to be compressed. The intervening runs of code symbols may thus be compressed using the invention, left uncompressed, or compressed using other compression schemes.

Additional compression can be achieved by adopting an additional rule that a repeat count with a field width of 32 specifies an "infinite" count so that the actual count need not be included. This allows the compressor to remove trailing zeroes from the output message, as long as the decompressor appends 32 zeroes to the message to enter the repeat rule. The compressor must also zero-fill the last byte actually output. A disadvantage of trimming zeroes is that the compressed record no longer explicitly contains the number of data values encoded, unless a stop code is defined. An advantage, however, is that a message containing, for example, all zeroes will compress into zero bits. Also, when spectral data falls to a baseline at high channel values, the few bytes saved per spectrum can become significant when tens of thousands of spectra are involved. When random access is desired to a large file of such channel code, a table containing 32 bit retrieval pointers to the start of each record is required. If the records are contiguous, such a table can be constructed from a 16 bit table of the lengths of each record, with the latter table compressed using the invention. The same method could be used to greatly compress retrieval pointers for dictionary or encyclopedic databases of large volumes of data.

The decoder applies whichever encoder rules are used in reverse. It is faster and easier to implement since all the compression decisions regarding escape codes, repeat counts, etc., have been previously made by the encoder.

Since decoder reconstruction is based on cumulative addition, when the channel codes represent forward differences, a bit error in the bottom bits of a data field will affect all subsequent data values. Other bit errors will disrupt the code framing, and quickly and inevitably, cause a catastrophic rise in the field width. The decoder can abort if the field length rises to an unreasonable value.

It is thus recognized that transmission errors through the channel can greatly corrupt the reconstructed information output from the decoder, and that an error correction method, optimized for the particular form of information, binary channel or binary storage media, and encoding/decoding scheme used, may be desirable to encapsulate the binary codes transmitted through the channel, in order to minimize the effect of transmission errors on the appearance or usage of the reconstructed information. The optimized error correction method might be different depending on whether the input information is in the form of voice, music, text, color images, continuous grayscale images, half-toned black and white images, etc., whether the binary channel is radio, optical, serial, or parallel in nature, and whether the binary storage medium is electronic, magnetic, optical, or otherwise in nature.

Using the invention, unless otherwise specified, all compressions are lossless, once the input data is converted to digital form.

Figure 2:
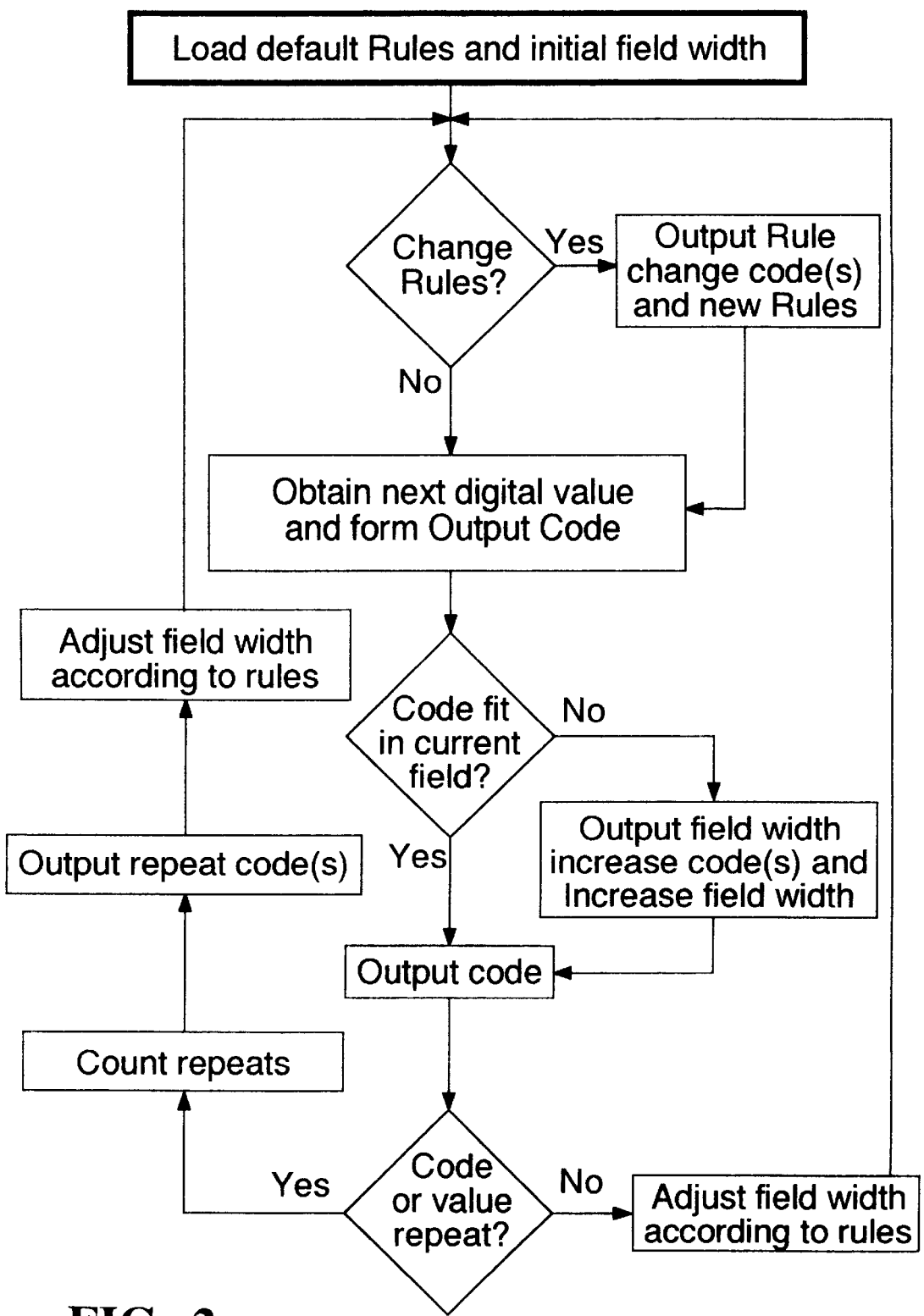
FIG. 2 is a flowchart for a general variable-bit-field encoder, according to the invention.

The invention includes the following general steps for a variable-bit-field difference compression encoder as shown in FIG. 2: (1) Load default rules and the initial field width; (2) Based on analysis of the type of input data and values, determine whether the rules should be changed; if so, a specific rule change sequence of channel codes is output, for example, escape-0-escape; (3) The next digitized value is obtained, is adjusted by a loss factor if loss is desired for greater compression, and the output code is formed; (4) If the result fits into the current field width, step (5) is skipped and the result is output; (5) If the result does not fit into the current field width, the increase codes are used to increase the field width such that the new data value fits into the current field; (6) If the digitized value (3) is a repeat of the previous value or code, count the number of repeats, and output the value or code repeat codes, adjust the field width according to the current rules, and begin again at step (2) for new data information; (7) If the digitized value of step (3) is not a repeat, adjust the field width according to the current rules, go back to step (2) and continue processing with the next rule change, data value or increase code.

Although as discussed above, FIG. 2 shows use of repeat codes for either repeated codes or values (along left side of figure), the repeat codes may be left out.

Figure 3:
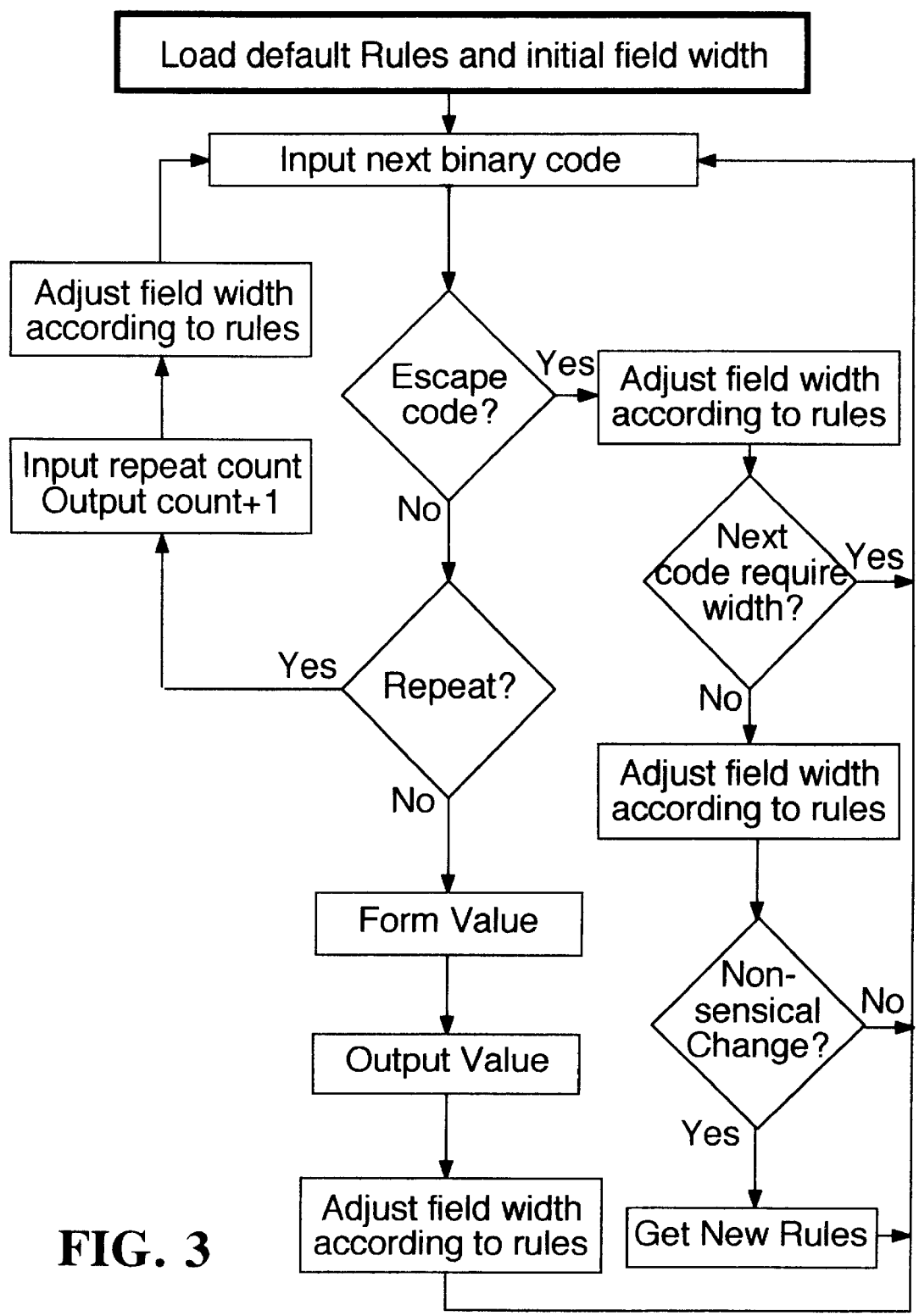
FIG. 3 is a flowchart for a general variable-bit-field decoder, used for the encoder of FIG. 2.

For decompressing (decoding) the data, the same overall steps are followed in reverse as shown in the decoder flow chart in FIG. 3. However, the decoder can always assume the current field width is adequate for the current data value.

In a more general example, the method of the invention of compressing digital data having a plurality of data sets into a series of encoded values (channel code), each encoded value having an associated field width, comprises:

(a) accessing the digital data with a digital processor;

(b) for each data value, utilizing the digital processor to set a field width and assign a channel code to each data value;

(c) if the channel code for a data value:

(i) fits within the field width, utilizing the digital processor to output the channel code in the field width;

(ii) does not fit within the field width, utilizing the digital processor to output the escape code and increase the field width by a predetermined incremental value, and to repeat the output of the escape code and increase of field width until reaching a new larger final field width which is large enough to contain the channel code, and then outputting the channel code in the larger final field width; and (d) repeating steps (b)–(c) for each subsequent data value.

The following example of employment of the invention is for data blocks containing positive integers only and uses a very simple set of rules. In this example, the rules are: (A) the initial field width W is 2; (B) W is incremented by 1 when the escape code $E=2^{W-1}$ is sent (received); (C) W is incremented by 1 when the current data is greater than $2^{W-2}$ and (D) is decremented by 1 when the current data is less than $2^{W-2}$.

Figure 4:
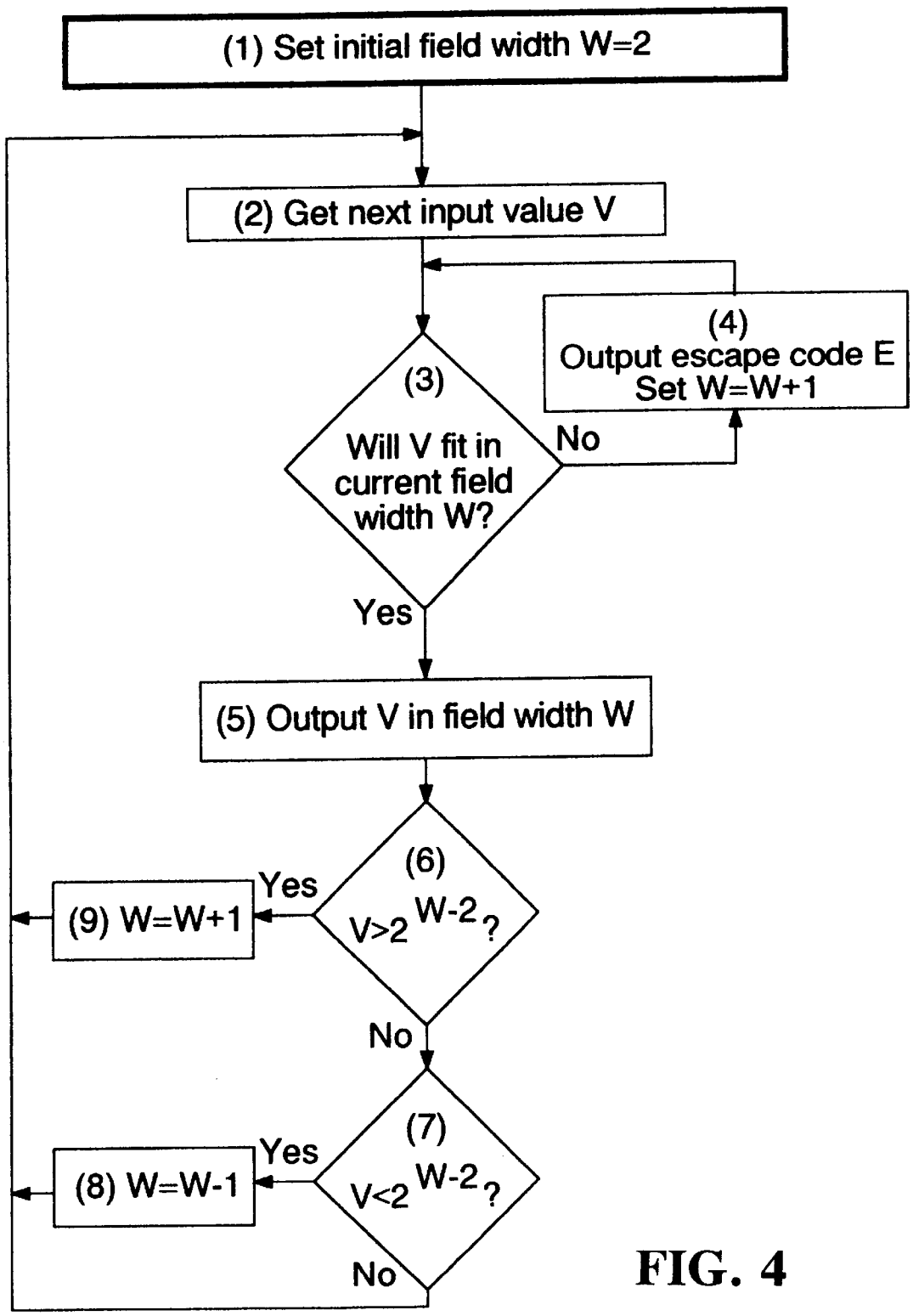
FIG. 4 is a flowchart for a simple variable bit field compression encoder, according to the invention.

Referring to FIG. 4, V is set to the first value to be sent in step 2.

In step 3, V is examined. If it fits within the current field width (i.e., $v<2^{W-1}$), V is sent (step 5). If it does not fit, step 4 is activated and the escape code is sent. This results in W being incremented by 1 under rule B. This process continues until W is large enough to contain V.

In step 6, V is again examined. If V is greater than $2^{W-2}$, W is incremented by 1 via step 9. If is less than $2^{W-2}$, W is decremented by 1 via step 8.

Steps (2)–(9) as appropriate are repeated for each succeeding input value V. The decoder applies the same rules in reverse to recover the original data.

The encoder may decide to adopt a new set of rules for the compression of each block of information. The decision may be based on a limited search starting from the set of rules which resulted in the best compression of previous blocks of information, or through the simple expedient of encoding the block using all available sets of rules, and choosing the set giving the best compression. For maximum encoding speed, the former method is used, while the greatest compression is obtained using the latter method.

In any case, the rules for a particular block need to cover when and by how much the bit field width W is to be increased and decreased, based implicitly on the current width W and the last encoded value V. The rules must also specify at least one "escape code" E for each value of W, to allow W to be increased explicitly when the current value to be sent will not fit within the current field width W.

Additionally, the rules may also cover how repeat counts are to be coded, when to apply a lossy preprocessor, hysteresis, how to reconstruct multichannel samples (stereo sound, RGB color images), and the like. For example, in the case of RGB color images, the green channel may be encoded with no loss and channel differences green-red and green-blue signals encoded with variable loss. This is based on the recognition that correlated information contained in a plurality of channels may be compressed more efficiently by encoding some combination of the channels rather than encoding each channel separately.

An embodiment that works well for spectral data defines V as the forward difference (the last data value minus the current data value), and four increment/decrement factors termed PlusMax, PlusMin, MinusMax and MinusMin. W is incremented by one (1) when the absolute value of the current number exceeds PlusMax (if positive) or MinusMax (if negative), and W is decremented by one (1) when the absolute value of the current number is less than PlusMin (if positive) or MinusMin (if negative). The four cofactors can be chosen to give the best compression for different types of spectral data. If there are four such parameters for every value of W, greater compression is possible. W may also be incremented or decremented by some number other than one (01).

In a preferred embodiment, the rules specify M (maximum field size), G (granularity), H (hysteresis), L (loss), W (field width), V (the data value), and $H_c$ (the hysteresis counter). In the more complicated example shown in FIG. 5 for a specific MGHL variable bit field difference encoder according to the invention, initial parameters are set for M=8; G=2; H=0; L=0; W=2; $H_c$=0. The decoder is shown in FIG. 6.

The invention may be used for any type of digital data, including audio, video, text, and graphic data.

For use of the invention with audio data on a CD, a laser lens "reads" channel codes stored on a compact disc by means known in the art, and converts the codes to result in an output of audio signals. For use with a sound recording made, for example, with a microphone, technology now available, for example, a MacIntosh system for converting audio voltages to digital output, is used to obtain the digital values.

A form of voice-operated recording may be obtained by compressing audio data as it is being recorded. When there is no sound to record, the data would have little variation, which could be efficiently compressed so that very little storage space is used until sound is detected. Since the recorder is permanently "on", the resultant digital recording accurately specifies the time when any sounds actually recorded were made, without consuming storage space while there is no sound to record.

The method of the invention may also be used for voice identification or control to the extent the compression pattern resulting from the speaking of a particular phrase or phrases is characteristic and unique to a particular person or phrase.

Since the compressibility of a given kind of data is a global property of each identified block of data, exploration of the compression/decompression method of the invention has potential usefulness in characterizing complex data of a wide variety of types and from a wide variety of sources, such as DNA sequences, sound, spectra, etc., with the compression pattern being a "fingerprint" related to the original sequence.

The method of the invention may also be used alone or in conjunction with other encryption schemes to provide secure encryption of data or voice. If arbitrary or changing rules are adopted by encoder and decoder, a form of secure encryption can be realized. For example, field length increment and decrement rules can be altered after each encoded value, based on a cyclic examination of the characters of a password. Thus, if the password were "elephant" and each letter of the password stood for a particular set of rules, the rules would change in the sequence specified by the letters in the word "elephant". Such a scheme, used alone, or in conjunction with other encrypting methods, could be very difficult to decode without knowing the password. Such encryption may or may not involve compression.

In a preferred embodiment, compression utilizing the invention may be increased for particular images if the encoding of image scan lines is done in alternating directions, or in some other direction than horizontal, or both.

The compression/decompression scheme of the invention operates with an input/output information rate in excess of thirty-two million bits per second, when programmed into a 40 MHz Motorola 68040 microprocessor. Further, use of the method of the invention can be realized very inexpensively using current technology for the fabrication of integrated circuits, to handle information rates well in excess of current commercial binary channel capacities.

The circuitry containing the rules of the method of the invention discussed above may be fabricated using methods known in the art. As used herein, "circuitry" includes software, and electronic, optical or other devices comprising a finite-state machine for the manipulation of binary digital data.

An apparatus for encoding digital data according to the invention may be simply an encoding and/or decoding device, or may be a data producing or handling device as is known in the art, which also includes the circuitry discussed above. Such an apparatus typically includes a receiver for receiving digital input data; a converter for converting input data to input values; means for assigning a field width to input values when encoding input values into channel codes, including means for providing that a field width to be used for each channel code depends on the preceding input value and the field width of the channel code for the preceding input value; and means for transferring the series of channel codes to a storage medium or to a decoder.

The apparatus may further comprise means for carrying out any of the rules of the invention, for example, means for establishing and utilizing an escape code for each data field width, wherein the field width for the channel code of a particular input value is incremented by a specified amount when the input value does not fit within the current field width; and/or means for utilizing a fast field increase mechanism to increase the field width when the channel code requires an abrupt increase in field width which would otherwise require three or more escape codes to effect the increase in field width.

The digital data which is encoded may be from a sound recording device, may be optical image data, spectral data, sampled time-domain signals, or may be any type of digital data from any other data producing or handling device.

The features and advantages of the present invention will be more clearly understood by reference to the following examples, which are not to be construed as limiting the invention.

EXAMPLES

EXAMPLE I

Figure 7:
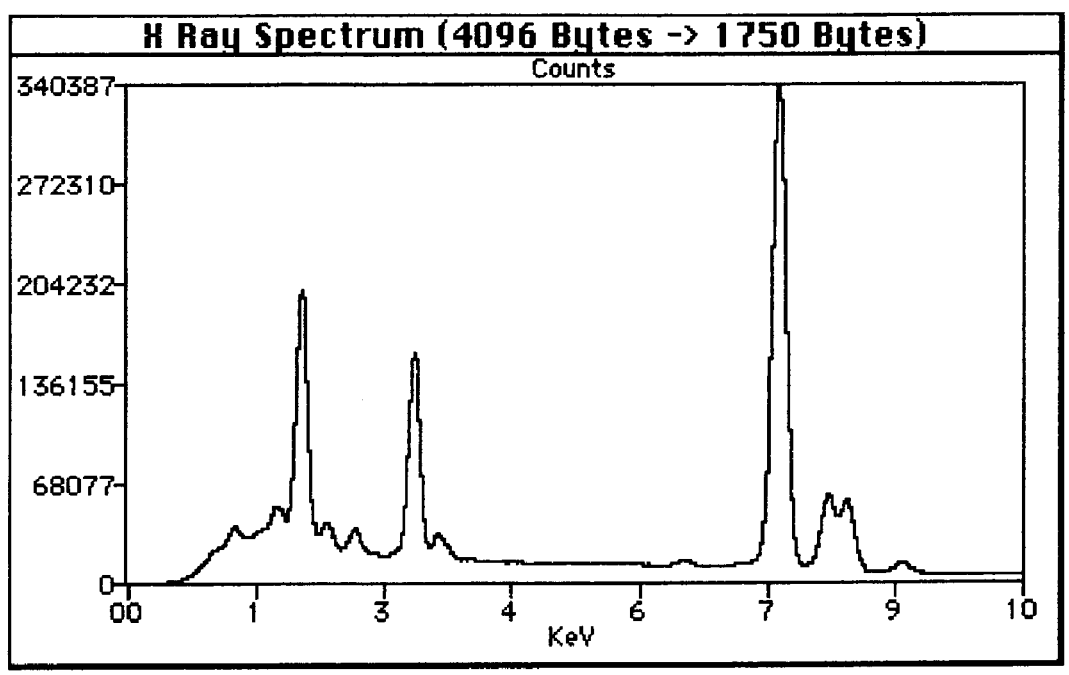
FIG. 7 is an example of an X-ray spectrum compressed and recovered losslessly with the method of the invention, providing data on the compression of the spectrum with the invention. The uncompressed and compressed sizes are shown in the title of each graph.

FIG. 7 shows an example of an electron-excited X-ray fluorescence spectrum lossly compressible with the method of the invention, providing data on the compression of the spectrum with the invention. The high number of potential counts requires data collection using four bytes for each of the 1024 channels. The uncompressed and compressed sizes are shown in the title of each graph. Compression ratios below 50% for such spectra are typical the when forward channel differences are compressed using the method of the invention. Similar results may be expected for other spectral or time domain signals, such as sonar, radar, EKG and EEG data.

EXAMPLE II

Figure 8:
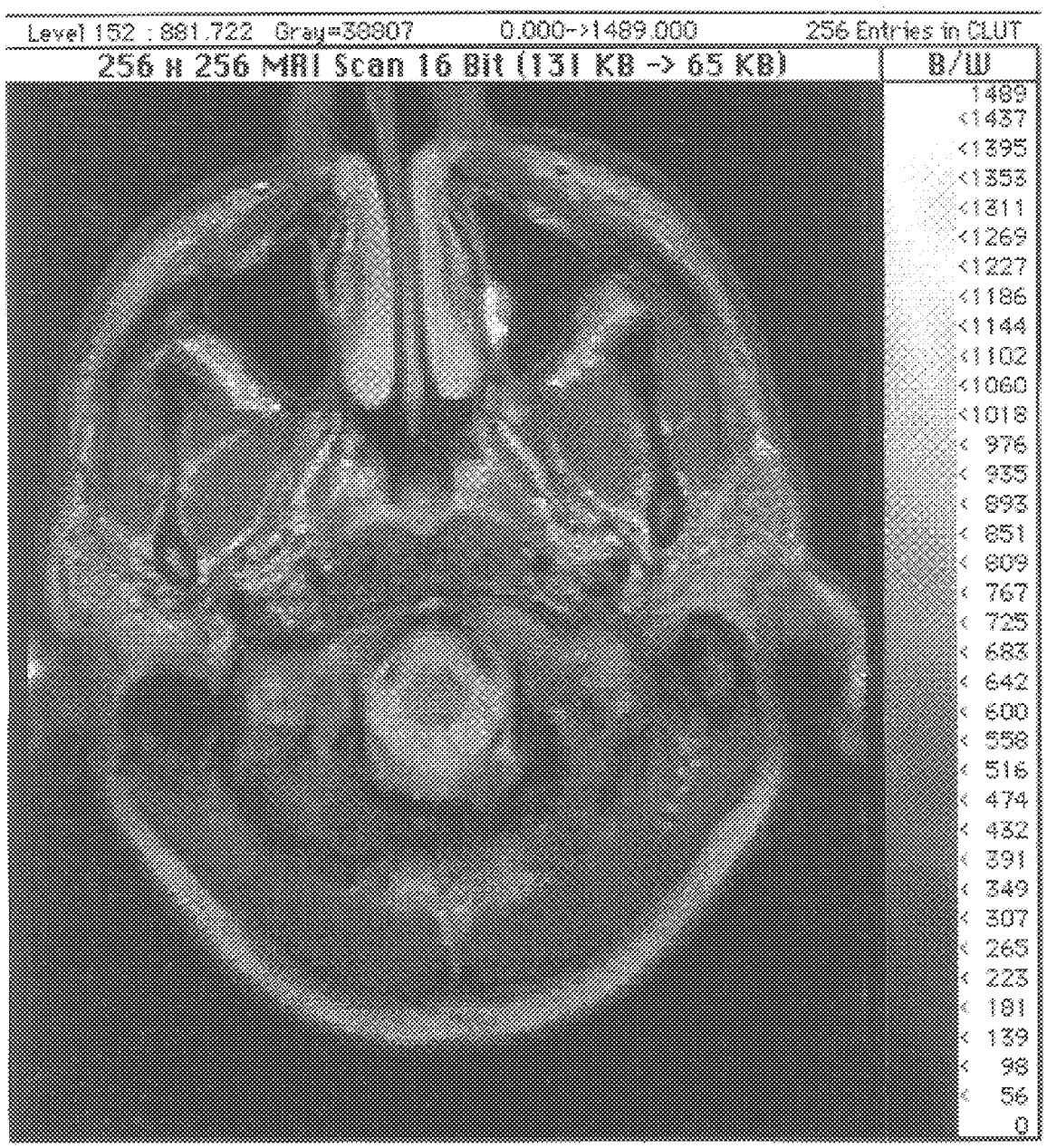
FIG. 8 is an example of an MRI scan which is compressed and recovered losslessly with the method of the invention, providing data on the compression of the MRI scan with the invention. The uncompressed and compressed sizes are shown in the title of each graph.

FIG. 8 is an example of an MRI scan which is losslessly compressible with the method of the invention, providing data on the compression of the MRI scan with the invention. The uncompressed and compressed sizes are shown in the title of each graph. Data for a transverse 256×256 MRI scan of a human head was compressed without loss, using the method of the invention. The resultant compression was from 131 KB to 65 KB. Another MRI brain scan having less contrast compressed from 131 KB to 55 KB.

EXAMPLE III

Figure 9:
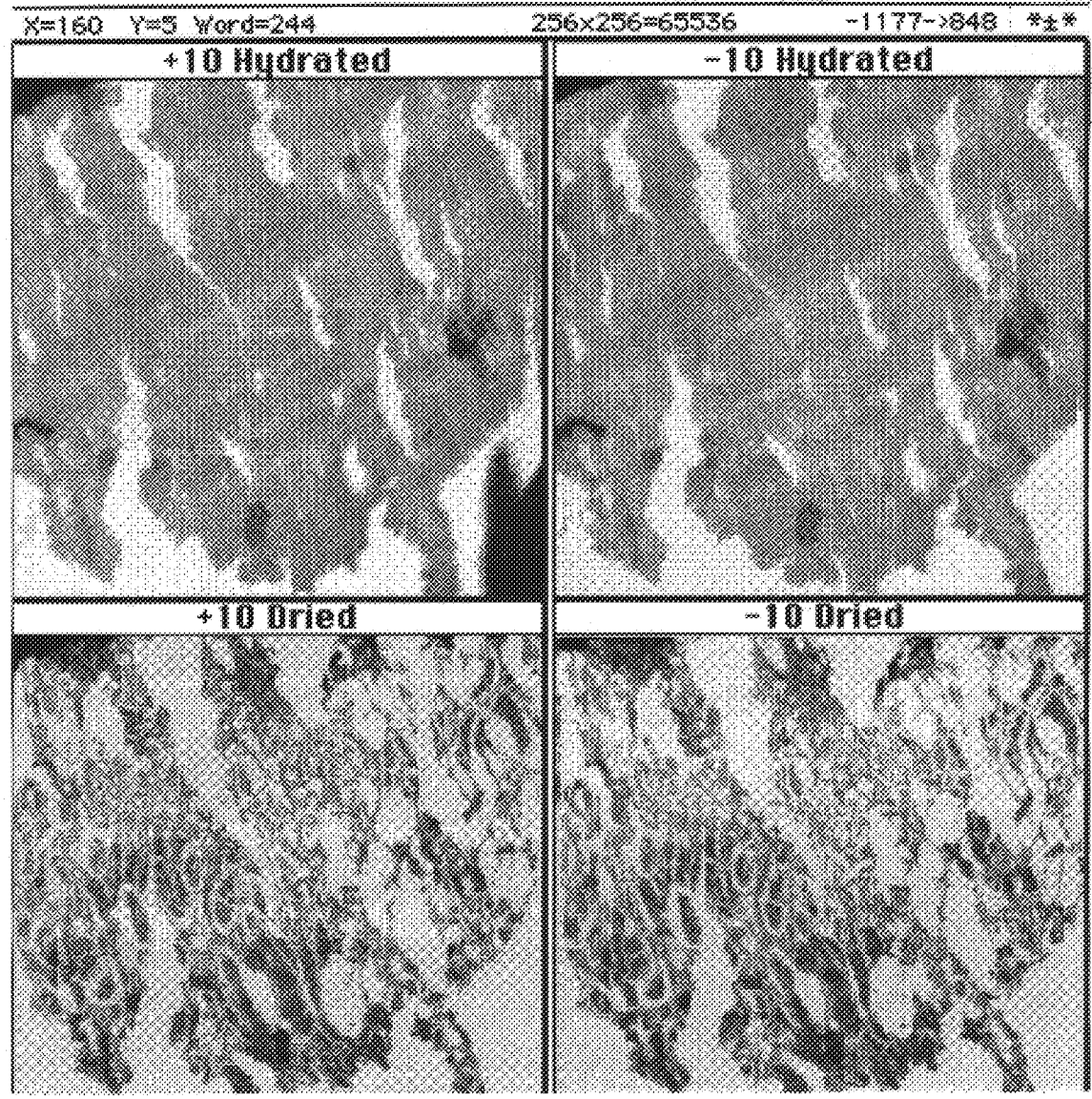
FIG. 9 is an example of an electron micrograph which is compressed and recovered losslessly with the method of the invention, providing data on the compression of the micrograph with the invention. The average compression ratio for the four images (2256×256, 16 bit) is 60%. The original magnification of each is 10,000 times.

FIG. 9 is an example of electron micrograph stereo pairs of frozen and freeze-dried kidney tissue, having twelve-bit, 256 ×256 images, and an original magnification of 10,000 times, which is losslessly compressible with the method of the invention. The uncompressed and compressed sizes are shown in the title of each graph. A compression factor of 50% is obtained using the method of the invention.

EXAMPLE IV

Figure 10:
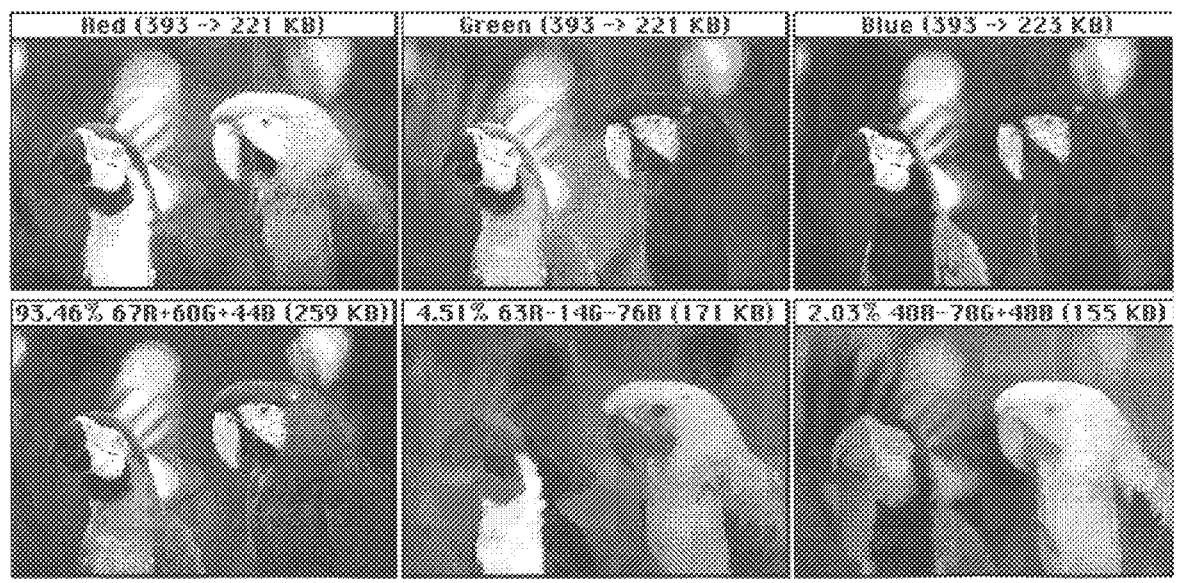
FIG. 10 shows copies of black and white images of a color picture providing data on the compression of the full color image. The top row shows compression of the 8-bit red, green and blue components, and the bottom row shows compression of the "principal color" images obtained from a principal component (also called Hotelling, eigenvector, or Karhunen-Loeve) transform. The uncompressed and compressed sizes are shown in the title of each graph.

In FIG. 10 black and white images of a color picture are shown providing data on the compression of full color images. The top row shows compression of the 8-bit red, green and blue components, and the bottom row shows compression of the principal color images. The uncompressed and compressed sizes are shown in the title of each graph. As shown, the compression for each color component was about from 393 KB to about 221 KB. The compression ratio is smaller for the principal component images having a lower variance, giving an overall lower compression ratio for the entire color image when compressed in principal color form.

EXAMPLE V

Figure 11:
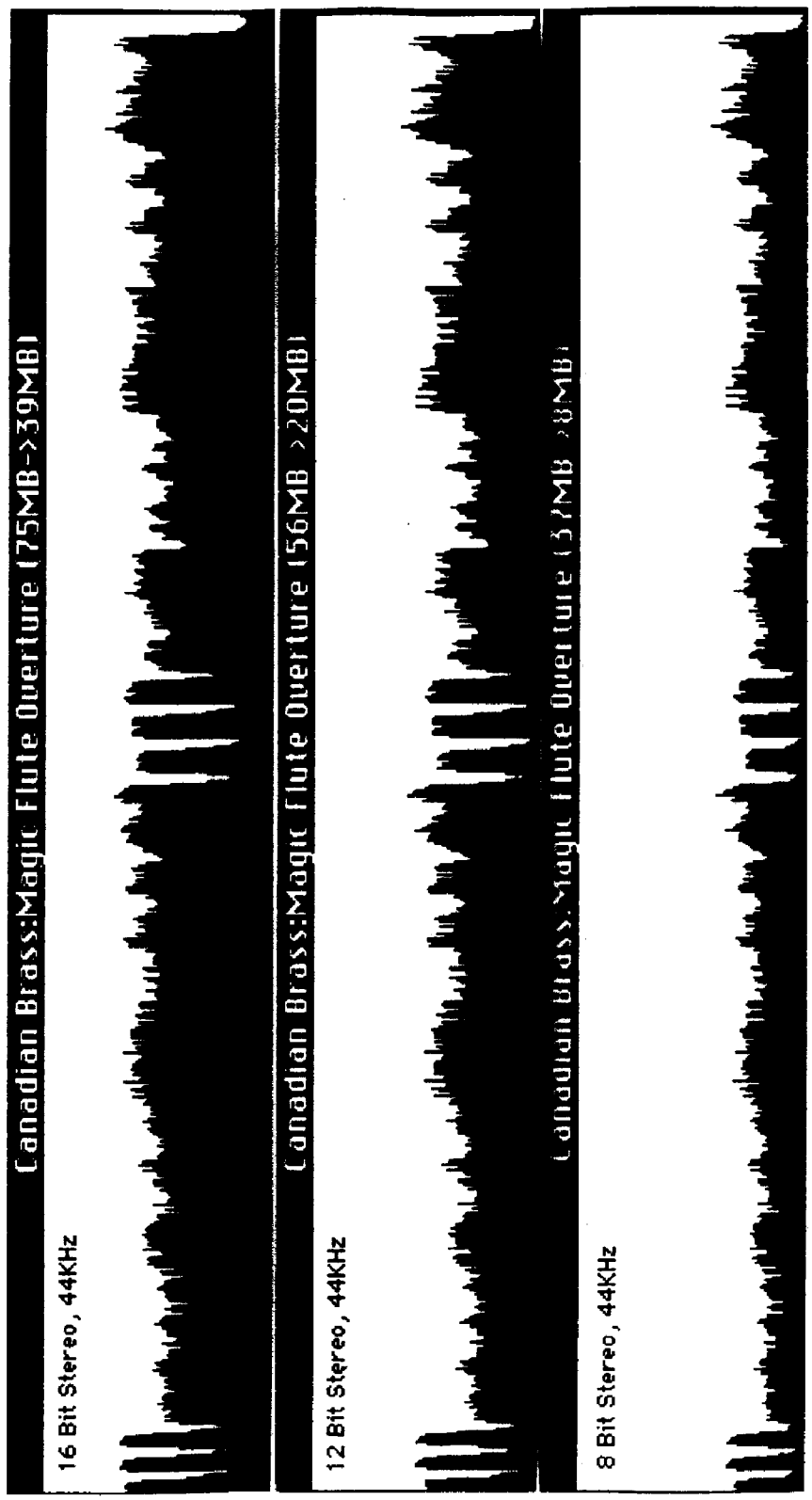
FIG. 11 shows wideband audio compression with lossless recovery using the method of the invention. The horizontal axes run from 0–423 seconds of music and the vertical axes correspond to the compression ratios of 0–100%. The percentage of white in each graph represents the storage saved through compression. The uncompressed and compressed sizes are shown in the title of each graph.

FIG. 11 shows wideband audio compression using the method of the invention. The three lines of peaks represent the amount of storage required to store data as a function of time. The horizontal axes run from 0–423 seconds of music and the vertical axes correspond to the compression ratios of 0–100%. The percentage of white in each graph represents the storage saved through compression. The uncompressed and compressed sizes are shown in the title of each graph. As noted in the heading of each line of peaks, the compression of the instrumental example (excerpt from overture on a commercial CD, "The Magic Flute") was from 75 MB to 39 MB in 16 bit stereo, from 56 MB to 20 MB in 12 bit stereo, and from 37 MB to 8 MB in 8 bit stereo, indicating that relative compression improves as lower bits are discarded.

EXAMPLE VI

Figure 12:
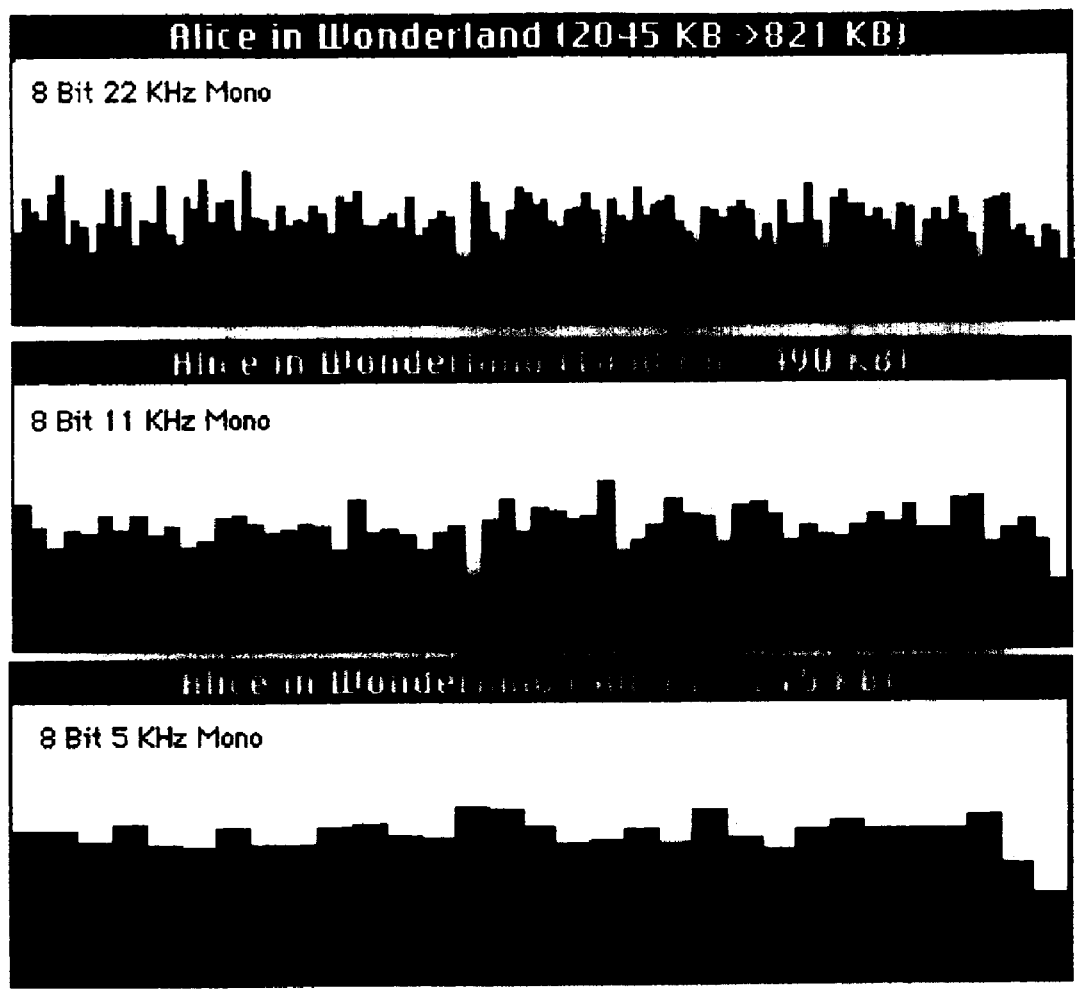
FIG. 12 shows voice compression with lossless recovery of a female voice reading the beginning of Lewis Carroll's "Alice's Adventures in Wonderland", initially digitized at 22, 11 and 5.5 KHz with an Apple Macintosh Quadra 650 personal computer and supplied microphone and software. The vertical axes correspond to the compression ratios of 0–100%. The percentage of white in each graph represents the storage saved through compression. The uncompressed and compressed sizes are shown in the title of each graph.

FIG. 12 shows voice compression of a female voice reading the beginning of Lewis Carroll's "Alice's Adventures in Wonderland", digitized at 22, 11 and 5.5 KHz with an Apple Macintosh Quadra 650 and supplied microphone and software. The vertical axes correspond to the compression ratios of 0–100%. The percentage of white in each graph represents the storage saved through compression. The uncompressed and compressed sizes are shown in the title of each graph. The relative compression improves as the sampling frequency is increased due to the increasing correlation of successive audio samples. If a better microphone is used in a sound studio, compression using the invention is increased by at least a 2-fold factor.

Figure 5:
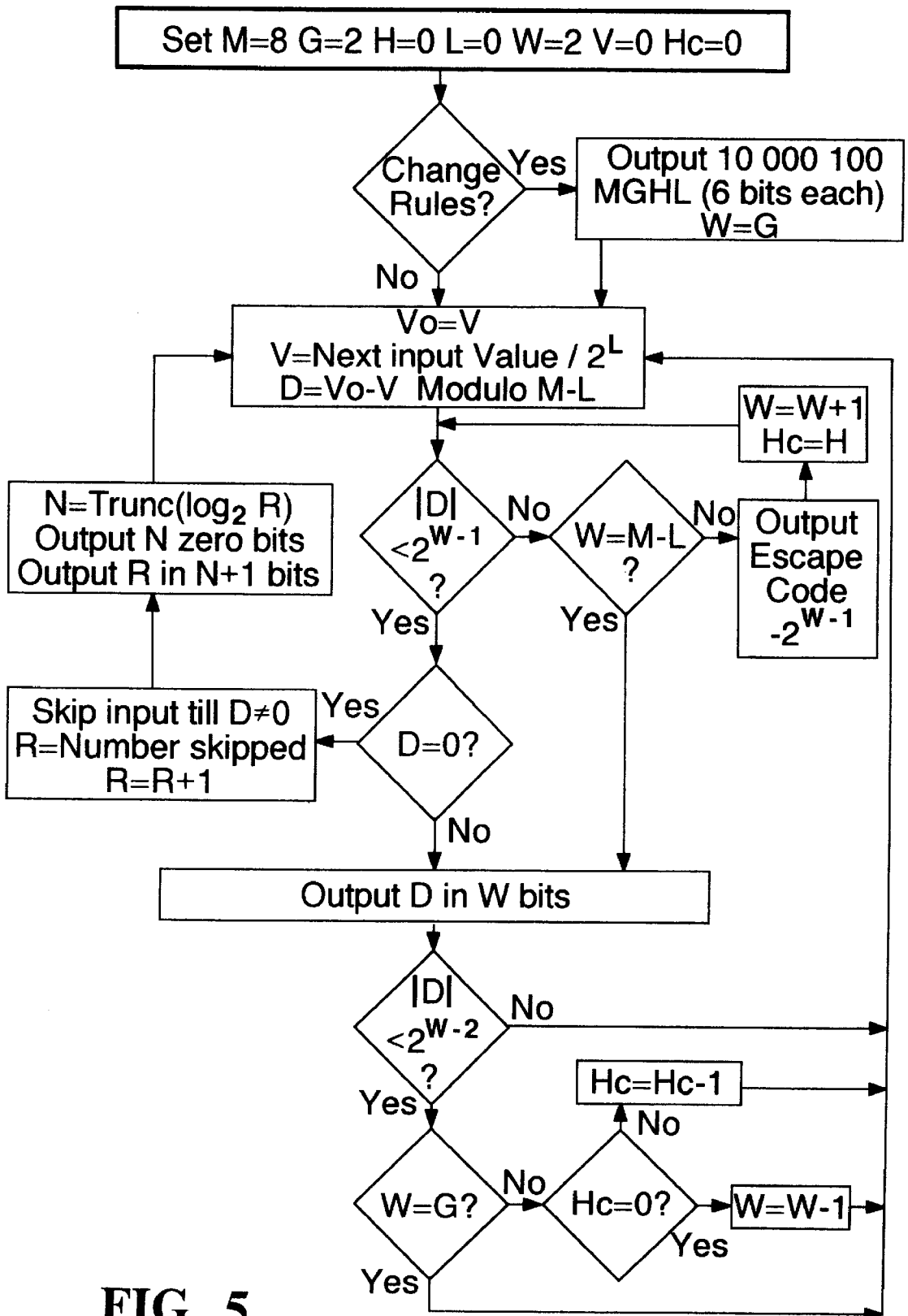
FIG. 5 is a flowchart for a more complex variable bit field compression encoder which give good compression ratios for audio and image data. Where a circled "X" appears in the main flow chart portion of this Figure and in FIG. 6, the small flow chart portion containing two X's is inserted.
Figure 6:
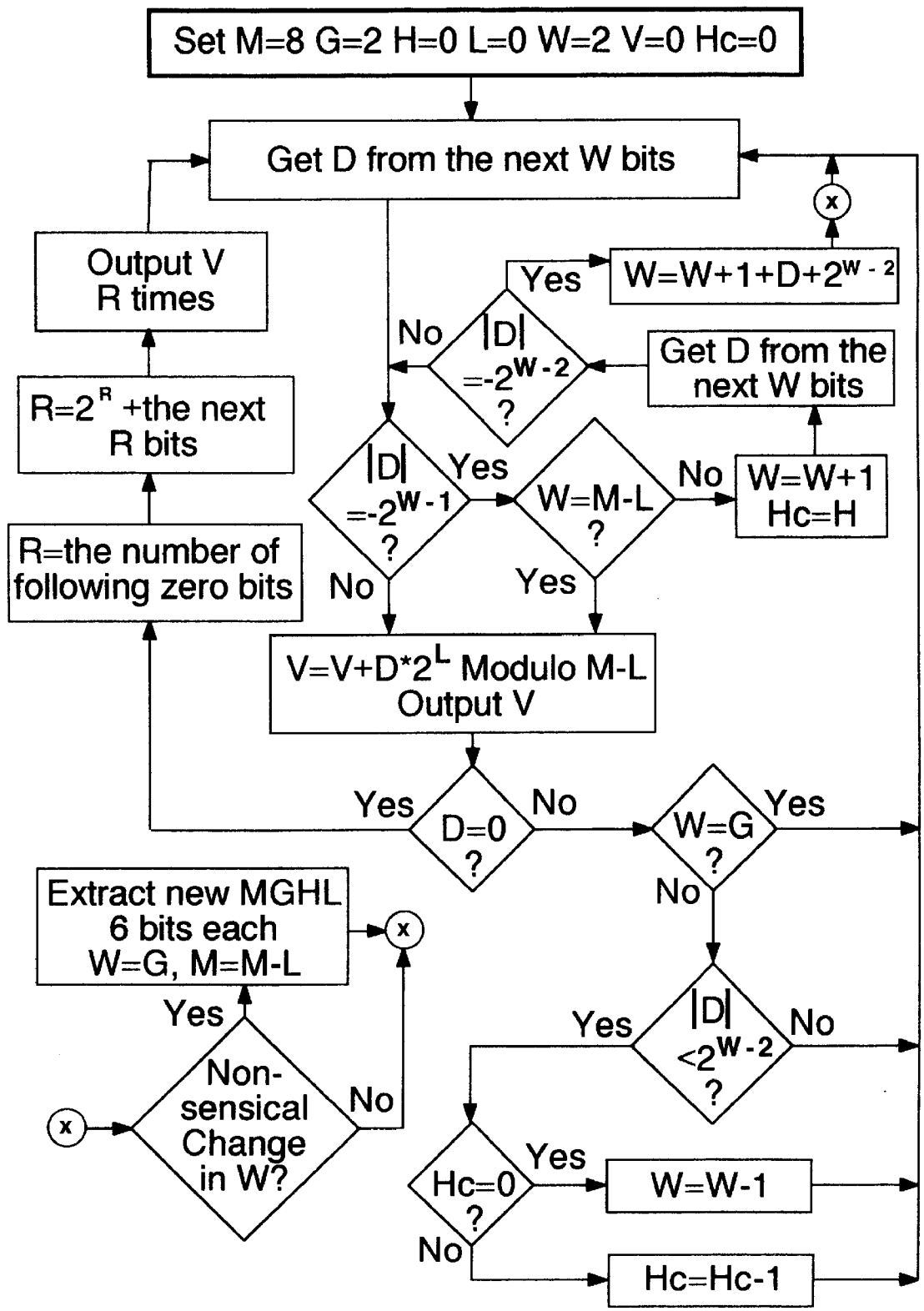
FIG. 6 is a flowchart for the decoder for the encoder of FIG. 5.

A listing of a Motorola 68040 assembly language subroutine for implementing in software a preferred data compressor according to the invention follows, which is very similar to the flowcharts of FIGS. 5 and 6.

While the invention has been described with reference to specific embodiments thereof, it will be appreciated that numerous variations, modifications, and embodiments are possible, and accordingly, all such variations, modifications, and embodiments are to be regarded as being within the spirit and scope of the invention.

36a

```
DoDAXMGHL   PROC    EXPORT   ;(iBuf,oBuf:Ptr;M,G,H,L,NX,NY,DX,DY:Integer):nByt:Long
*
*DAX compresser for general byte, word, or longword data streams
*D.Kopf, Pittsboro, NC, USA
*First parameter change encoded in 6 bit fields as 10 000 100 MGHL=$84MGHL
*Input format (byte, word, longword) is determined from the magnitude of M
*
Frame   RECORD  {A6Link},DECR
    nByt    DS.L    1       ;<- ;Returned value, # Bytes after compression
    iBuf    DS.L    1       ;-> ;input buffer pointer
    oBuf    DS.L    1       ;-> ;output buffer pointer
    M       DS.W    1       ;-> ;Maximum field width 2-31
    G       DS.W    1       ;-> ;Granularity 1-31
    H       DS.W    1       ;-> ;Hysteresis 0-31
    L       DS.W    1       ;-> ;Loss 0-31
    NX      DS.W    1       ;-> ;# Values per line
    NY      DS.W    1       ;-> ;# Lines to do
    DX      DS.W    1       ;-> ;# bytes to skip between input bytes
    DY      DS.W    1       ;-> ;# bytes between lines (RowBytes)
    Return  DS.L    1           ;Return address
    A6Link  DS.L    1           ;Link point
    Factor  DS.L    1           ;Adjustment for next row counter
    Offset  DS.W    1           ;Offset for next line address
FSize   EQU     *
        ENDR
    WITH Frame
        LINK    A6,#FSize
        MOVEM.L D2-D7/A2-A5,-(SP)
        CLR.L   D4                  ;Set output length zero
        MOVE.W  NY(A6),D7           ;# Lines to do
        SUBQ.W  #1,D7               ;Zero based
        BLT.W   F                   ;Exit if zero
        SWAP    D7
        MOVE.W  NX(A6),D7           ;# bytes per line to do
        BLE.W   F                   ;Exit if zero
        MOVEQ.L #1,D0               ;Set up decrement factor
        SWAP    D0
        MOVE.W  D7,D0
        NEG.W   D0
        MOVE.L  D0,Factor(A6)       ;=$0001(-bpl)
        ADD.W   DY(A6),D0           ;Rowbytes-Bytes per line
        MOVE.W  D0,Offset(A6)       ;offset between rows MOVE.L  oBuf(A6),A2     ;A2 ;Base address of output buffer
        MOVE.L  iBuf(A6),A3     ;A3 ;Base address of input buffer
        CLR.L   D3
        CLR.L   D6
        MOVE.W  L(A6),D3        ;D3 ;Loss factor
        MOVE.W  G(A6),D6        ;D6 ;Granularity
        BNE.S   @2
        MOVEQ.L #2,D6               ;Default=2
@2      MOVE.W  M(A6),A4        ;A4 ;Maximum field width
        MOVE.W  A4,D2

CLR.L   D0
        BFSET   D0{0,1}
        BFSET   D0{5,1}
        BFINS   D2,D0{08:6}         ;Encode maximum field
        BFINS   D6,D0{14:6}         ;Granularity
        MOVE.W  H(A6),D1
        BFINS   D1,D0{20:6}         ;Hysteresis
        BFINS   D3,D0{26:6}         ;Loss
```

36b
HD40:DAXCodecMGHLa                                                      Page 2

```
        CMP.L    #$84202000,D0      ;Are they the defaults?
        BEQ.S    PMods
        MOVE.L   D0,(A2)            ;No, encode in first word
        MOVEQ.L  #32,D4

PMods                              ;Free up registers via some niffy p-space mods
        MOVEQ    #$30,D0            ;Operand load instructions
        CMP.B    #16,D2
        BEQ.S    @2
        BLT.S    @1
        MOVEQ    #$20,D0
        BRA.S    @2
@1      MOVEQ    #$10,D0
@2      LEA      @N1(PC),A0
        MOVE.B   D0,(A0)            ;MOVE.B,W,L (A3),D0
        LEA      @R7(PC),A0
        ADDQ     #2,D0
        MOVE.B   D0,(A0)            ;MOVE.(B,W,L) (A3),D1

MOVE.W   #$48C3,D0          ;Sign extend instruction
        CMP.B    #16,D2
        BEQ.S    @4
        BLT.S    @3
        MOVE.W   #$4E71,D0          ;NOP if long
        BRA.S    @4
@3      MOVE.W   #$49C3,D0
@4      LEA      @C1(PC),A0         ;EXT(B,W).L D3
        MOVE.W   D0,(A0)

MOVE.W   DX(A6),D0          ;Operand increment instructions
        LSL.B    #1,D0              ;ADDQ    #DX,A3
        OR.B     #$50,D0
        LEA      @A1(PC),A0
        MOVE.B   D0,(A0)
        LEA      @A2(PC),A0
        MOVE.B   D0,(A0)
        LEA      @A3(PC),A0         ;SUBQ    #DX,A3
        ADDQ     #1,D0
        MOVE.B   D0,(A0)

CLR.L    D0
        SUB.B    D3,D0              ;Shift right instruction
        ADD.B    D2,D0
        AND.B    #$001F,D0
        SUB.W    #32,D2
        NEG.W    D2
        LSL.W    #6,D2
        OR.W     D2,D0
        LEA      @L1+2(PC),A0
        MOVE.W   D0,(A0)            ;BFEXTS D0{32-M:-L},D0
        LEA      @L2+2(PC),A0
        BSET     #12,D0
        MOVE.W   D0,(A0)            ;BFEXTS D1{32-M:-L},D1

CPUSHA   DC                 ;Push 68040 data cache
        CPUSHA   IC                 ;Invalidate 68040 instruction cache SUB.L    D3,A4              ;Reduce modulus by loss
        MOVE.L   D6,A1              ;A1 ;Saved granularity
        CLR.L    D0                 ;Previous value of zero
        CLR.L    D2                 ;D2 ;Hysteresis counter
        CLR.L    D3
```

36c
HD40:DAXCodecMGHLa.a          Page 3

```
;EncodeLoop
@ES  CLR.L    D5                   ;Form escape code
     BSET     D6,D5
     ASR.L    #1,D5            ;D5 ;Escape code
@NS  MOVE.L   D0,D1                ;Copy last value
     DBRA     D7,@N1               ;Decrement row counter
     SUB.L    Factor(A6),D7          ;Decrement line counter
     BLE.W    F                      ;Finished?
     ADD.W    Offset(A6),A3          ;No, bias to next line
@N1  MOVE.B   (A3),D0              ;Get next value - planted B,W or L
@A1  ADDQ     #1,A3                ;Increment address - planted from DX
@L1  BFEXTS   D0{0:0},D0           ;Adjust by loss factor - planted
     SUB.L    D0,D1            ;D1 ;Difference from previous value
     BEQ.W    @Repeat              ;Go do repeat count if zero @TS  MOVE.L   D1,D3                ;Count # bits in value
@C1  EXTB.L   D3                   ;Sign extend to long - planted
     BGE.S    @T2
     NEG.L    D3
@T2  BFFFO    D3{0:0},D3
     SUB.W    #32,D3
     NEG.W    D3
     CMP.B    D6,D3                ;Current field width enough?
     BGE.S    @Expand              ;No, expand @Vo  BFINS    D1,(A2){D4:D6}       ;Yes, Output the value
     ADD.L    D6,D4
;    SUBQ.W   #1,D2                ;Decrement pre-check Hp counter
;    BGT.S    @NS                  ;No reduction till zero
;    CLR.W    D2
     ADDQ.W   #1,D3
     CMP.B    D6,D3                ;Decrease field width?
     BGE.S    @NS                  ;No, go to next value
     CMP.L    A1,D6                ;At current granularity?
     BLE.S    @NS                  ;Yes, no reduction
     SUBQ.W   #1,D2                ;Decrement post-check Hc counter
     BGT.S    @NS                  ;No reduction till zero
     CLR.W    D2
     SUBQ.L   #1,D6                ;Reduce W by 1
     LSR.L    #1,D5                ;Form new escape code
     BRA.S    @NS @Expand
     BFINS    D5,(A2){D4:D6}       ;Output escape code
     ADD.L    D6,D4
     CMP.W    A4,D6                ;IF N=M, no increment
     BEQ.S    @NS
     MOVE.W   H(A6),D2             ;Bump hysteresis counter
     ADDQ.L   #1,D6                ;Increase field length
     ASL.L    #1,D5                ;adjust escape code
     MOVE.W   D3,A0                ;Save required field length
     EXTB.W   D3
     CMP.W    A4,D3                ;Asking for maximum+1?
     BLT.S    @E1
     SUBQ.B   #1,D3                ;Only need maximum
@E1  SUB.B    D6,D3
;following comes through harmlessly with D3=0 the second time
     BEQ.S    @Expand              ;Output another escape if only 1 more needed
     BGE.S    @E2                  ;Rapid expand if more needed
     MOVE.W   D6,D3
     BRA.S    @Vo                  ;Output if will fit now ;Special rule for extra compression of 8 bit sound and images
```

```
                        36d
                        HD40:DAXCodecMGHLa.a                              Page 4

@E2   CMP.B    #4,D3             ;Asking for 5?
      BNE.S    @E3
      CMP.W    #8,A4             ;with max field 8? (i.e., 3->8)
      BNE.S    @E3
      SUBQ.B   #1,D3             ;3->7 is same as 3->8

@E3   ASR.W    #1,D5             ;Needs 2 or more bits
      SUB.W    D5,D3             ;Bias by most negative number
      ASL.W    #1,D5

CMP.B    #2,D3             ;Are we asking for 2 or more?
      BLT.S    @E8
      CMP.W    #3,D6             ;In field of 3?
      BNE.S    @E4
      BRA.S    @TS               ;Send another escape
@E4   CMP.B    #4,D3             ;4 for more
      BLT.S    @E8
      CMP.W    #4,D6             ;In field of 4?
      BNE.S    @E8
      BRA.W    @TS               ;Send another escape @E8   BFINS    D3,(A2){D4:D6}    ;Output expansion amount
      ADD.L    D6,D4
      ASR.W    #1,D5
      ADD.B    D5,D3
      ASL.W    #1,D5
      ADDQ.B   #1,D3
      CMP.B    #4,D3             ;3->7?
      BNE.S    @E9
      CMP.W    #8,A4             ;with max field 8? (i.e., 3->8)
      BNE.S    @E9
      ADDQ.B   #1,D3
@E9   ADD.B    D3,D6             ;Adjust current field width
      ASL.L    D3,D5             ;and escape code
      MOVE.W   A0,D3             ;Restore required width
      BRA.W    @Vo               ;Output the value @Repeat
      CLR.L    D5                ;Count # of repeats to follow
@R1   DBRA     D7,@R3            ;Increment row counter
      SUB.L    Factor(A6),D7         ;Advance to next row
      BGT.S    @R2
      ADDQ.L   #1,D5                 ;If finished, add 1 repeat
      MOVEQ    #-1,D7                ;So next test will exit
      BRA.S    @R4                   ;Output repeat count
@R2   ADD.W    Offset(A6),A3         ;Bias to next line
@R3   ADDQ.L   #1,D5
@R7   MOVE.B   (A3),D1           ;Get next value - planted
@A2   ADDQ     #1,A3             ;Increment to next - planted
@L2   BFEXTS   D1{0:0},D1        ;Adjust by loss factor - planted
      CMP.L    D1,D0             ;Repeat?
      BEQ.S    @R1               ;Yes, keep counting
@A3   SUBQ     #1,A3             ;No, Back up - planted @R4   ADDQ.W   #1,D7             ;increment counter
      BFCLR    (A2){D4:D6}       ;Output zero at current field width
      ADD.L    D6,D4
      SUBQ.L   #1,D5             ;# repeats remaining
      BNE.S    @R6
      BFSET    (A2){D4:1}        ;Set 1 bit for no repeats
      ADD.L    #1,D4
      BRA.W    @ES               ;On to next value
```

36e
HD40:DAXCodecMGHLa.                                    Page 5

```
@R6    BFFFO    D5{0:0},D1           ;Get field length for repeat
       SUB.W    #32,D1
       NEG.W    D1
       BFCLR    (A2){D4:D1}          ;Output zeros
       ADD.L    D1,D4
       BFINS    D5,(A2){D4:D1}       ;Output repeat count, top bit set
       ADD.L    D1,D4
       BRA.W    @ES                  ;On to next value F      BFCLR    (A2){D4:8}           ;Zero-fill the last byte
       ADDQ.L   #7,D4                ;Round up
       LSR.L    #3,D4                ;# Bytes output
       MOVE.L   D4,nByt(A6)          ;Return the byte count
X      MOVEM.L  (SP)+,D2-D7/A2-A5
       UNLK     A6
       RTD      #Frame-12
       ENDPROC

*************************************************************************
UnDoDAXMGHL PROC   EXPORT   ;(iBuf,oBuf:Ptr;NX,NY,DX,DY:Integer);
*
*DAX decompresser for general byte, word, or longword data streams
*D.Kopf, Pittsboro, NC, USA
*
*First parameter change encoded in 6 bit fields as 10 000 100 MGHL=$84MGHL
*Output format (byte, word, longword) is determined from the magnitude of M
*
Frame    RECORD  {A6Link},DECR
iBuf           DS.L    1       ;->  ;input buffer pointer
oBuf           DS.L    1       ;->  ;output buffer pointer
NX             DS.W    1       ;->  ;# Values per line
NY             DS.W    1       ;->  ;# Lines
DX             DS.W    1       ;->  ;# values to skip between output values
DY             DS.W    1       ;->  ;# bytes between lines (RowBytes)
Return         DS.L    1            ;Return address
A6Link         DS.L    1            ;Link point
Factor         DS.L    1            ;Adjustment for next line counter
Offset         DS.W    1            ;Offset for next line address
L              DS.W    1            ;Loss factor
H              DS.W    1            ;Hysteresis
FSize    EQU     *
         ENDR
WITH Frame
    LINK     A6,#FSize
    MOVEM.L  D2-D7/A2-A5,-(SP)
    MOVE.W   NY(A6),D7           ;# Lines to do
    SUBQ.W   #1,D7               ;Zero based
    BLT.W    F
    SWAP     D7
    MOVE.W   NX(A6),D7           ;# Values per line
    BLE.W    F
    MOVEQ.L  #1,D0               ;Set up decrement factor
    SWAP     D0
    MOVE.W   D7,D0
    NEG.W    D0
    MOVE.L   D0,Factor(A6)       ;=$0001(-vpl)
    MOVE.L   oBuf(A6),A3      ;A3 ;Base address of output buffer
    MOVE.L   iBuf(A6),A2      ;A2 ;Base address of input buffer
    CLR.L    D4               ;D4 ;Start at beginning of input buffer
    MOVEQ.L  #8,D0
    MOVE.W   D0,A4            ;A4 ;Modulus, Default=8
    CLR.L    D3               ;D3 ;Loss factor, Default=0
```

```
                                36f
                        HD40:DAXCodecMGHLa.a                       Page 6

MOVEQ    #2,D6              ;D6 ;Granularity, Default=2
        CLR.L    D2                 ;D2 ;Hysteresis, Default=0

CMP.B    #$84,(A2)              ;Explicit params present?
        BNE.S    @1                     ;No
        BFEXTU   (A2){08,6},D0          ;Yes, replace defaults
        MOVE.W   D0,A4                  ;Modulus
        BFEXTU   (A2){14,6},D6          ;Granularity
        BFEXTU   (A2){20,6},D2          ;Hysteresis
        BFEXTU   (A2){26,6},D3          ;Loss
        MOVEQ    #32,D4

@1      MOVE.W   DX(A6),D1              ;Distance between bytes
        MOVE.W   D1,A5              ;A5 ;DX
;
PMods                               ;Free up registers via some niffy p-space mods
        MOVE.W   #$1680,D1              ;MOVE.B
        CMP.W    #8,A4                  ;Byte operand?
        BLE.S    @2                     ;Yes
        ADD.L    A5,A5                  ;No
        MOVE.W   #$3680,D1              ;MOVE.W
        CMP.W    #16,A4                 ;Word operand?
        BLE.S    @2                     ;Yes
        MOVE.W   #$2680,D1              ;No
        ADD.L    A5,A5                  ;MOVE.L
@2      LEA      O1(PC),A0
        MOVE.W   D1,(A0)                ;MOVE.X D0,(A3)
        LEA      O2(PC),A0
        MOVE.W   D1,(A0)                ;MOVE.X D0,(A3)

CPUSHA   DC                     ;Push 68040 data cache
        CPUSHA   IC                     ;Invalidate 68040 instruction cache MOVE.L   A5,D1                  ;Compute odd row bytes
        SUBQ     #1,D1
        MOVE.W   DY(A6),D0              ;Rowbytes
@3      SUB.W    NX(A6),D0              ;-Bytes per line
        DBRA     D1,@3
        MOVE.W   D0,Offset(A6)          ;offset between rows CLR.L    D5                     ;Form escape code
        BSET     D6,D5
        ASR.L    #1,D5
        NEG.L    D5                 ;D5 ;Escape code
        MOVE.W   D3,L(A6)
        MOVE.W   D2,H(A6)
        SUB.L    D3,A4                  ;Reduce modulus by loss
        MOVE.L   D6,A1              ;A1 ;Save granularity
        MOVE.L   D5,A0              ;A0 ;and corresponding escape code
        CLR.L    D2                     ;Start with no hysteresis
        CLR.L    D0                     ;Start with previous value of zero NV      DBRA     D7,NV2                 ;Decrement row counter
        SUB.L    Factor(A6),D7              ;Decrement line counter
        BLE.W    F                          ;Finished?
        ADD.W    Offset(A6),A3              ;No, bias to next line
NV2     BFEXTS   (A2){D4:D6},D1     ;D1 ;Get next value
        BEQ.S    Repeat                 ;If it's zero, do repeat count
        ADD.L    D6,D4                  ;Non-zero code was present
        CMP.L    D1,D5                  ;Escape value?
        BEQ.S    Expand                 ;Yes, expand field size Out     ASL.L    D3,D1                  ;Shift left by loss factor
```

HD40:DAXCodecMGHLa.a                                              Page 7

```
        SUB.L    D1,D0            ;Form running sum
        ASR.L    D3,D1
O1      MOVE.W   D0,(A3)          ;Output next value
        ADD.L    A5,A3
;       SUBQ.W   #1,D2            ;Decrement pre-check Hp counter
;       BGT.S    NV               ;No reduction till zero
;       CLR.W    D2
        CMP.L    A1,D6            ;Width minimum?
        BLE.S    NV               ;Yes, no reduction
        ASL.L    #1,D1            ;Check top two bits
        BGT.S    @3
        NOT.L    D1
        ADDQ.L   #1,D1            ;Don't reduce if 1100...
@3      AND.L    D5,D1            ;using escape code
        BNE.S    NV               ;No reduction if using whole field
        SUBQ.W   #1,D2            ;Decrement post-check Hc counter
        BGT.S    NV               ;No reduction till zero
        CLR.W    D2
        SUBQ.L   #1,D6            ;else reduce by 1 bit
        ASR.L    #1,D5
        BRA.S    NV Expand
        CMP.W    A4,D6            ;At maximum field size?
        BEQ.S    Out              ;Yes, treat as difference
        ADDQ.W   #1,D6            ;Increment field width
        ASL.L    #1,D5            ;and escape value
        MOVE.W   H(A6),D2         ;Initialize hyst counter
        BFEXTS   (A2){D4:D6},D1   ;Examine the next value
        ADD.L    D6,D4
        CMP.L    D1,D5            ;Another escape?
        BEQ.S    Expand           ;Yes, increment field size again
        MOVE.L   D1,D2            ;Test top two bits
        BGE.S    @E1              ;Make positive
        NOT.L    D2
        ADDQ.L   #1,D2            ;Don't reduce if 1100...
@E1     ASL.L    #1,D2
        AND.L    D5,D2
        BEQ.S    @E3              ;Did not require the expansion, its an increment c
        SUB.L    D6,D4            ;It's the next code, back up
        MOVE.W   H(A6),D2         ;Initialize hyst counter
        BRA.S    NV2              ;Faster to not back up, must then dec D7
@E3     ASR.L    #1,D5            ;Bias by the most negative value
        SUB.L    D5,D1
        ASL.L    #1,D5
        ADDQ.L   #1,D1            ;Two-offset
        CMP.B    #4,D1            ;3->7 is same as 3->8
        BNE.S    @E4
        CMP.W    #8,A4            ;with max field 8
        BNE.S    @E4
        ADDQ.W   #1,D1
@E4     ADD.L    D1,D6            ;Increment field
        ASL.L    D1,D5            ;adjust escape code
        MOVE.W   H(A6),D2         ;Initialize hyst counter
        BRA.S    NV2              ;Process next code Repeat
        ADD.L    D6,D4
        CLR.L    D5
        MOVEQ.L  #31,D3           ;Count # of zero bits following
        BRA.S    @2
@1      ADDQ.L   #1,D4
@2      BFTST    (A2){D4:1}
```

```
                36h
        HD40:DAXCodecMGHLa.a                          Page 8

DBNE      D3,@1
   BNE.S     @3
   MOVEQ.L   #-1,D5          ;IF 32 bits, take infinite count
   BRA.S     Z4
@3 NEG.W     D3
   ADD.W     #31,D3
   BEQ.S     O2
   BFEXTU    (A2){D4:D3},D5  ;Extract the count
   SUBQ.L    #1,D3
   ADD.L     D3,D4
   BRA.S     O2
Z4 DBRA      D7,O2           ;Decrement row counter
   SUB.L     Factor(A6),D7      ;Decrement line counter
   BLE.S     F                  ;Finished?
   ADD.W     Offset(A6),A3      ;No, bias to next line
O2 MOVE.B    D0,(A3)         ;Output repeat
   ADD.L     A5,A3
   DBRA      D5,Z4
   SUB.L     #$10000,D5
   BGE.S     Z4
   ASL.L     D6,D5           ;Reform escape code
   ASR.L     #1,D5
   ADDQ.L    #1,D4
   MOVE.W    L(A6),D3        ;Reload loss factor
   BRA.W     NV F
X  MOVEM.L   (SP)+,D2-D7/A2-A5
   UNLK      A6
   RTD       #Frame-8
   ENDPROC
```

What is claimed is:

1. A method of compressing a sequential stream of digital input values obtained from input data into binary, digital channel codes in a plurality of fields using a digital processor, each binary, digital channel code with an associated field width comprising a number of binary digits in the channel codes comprising providing that, in the absence of any explicit additional channel codes or rules which specify the field width to be used for the next channel code, the field width to be used for each channel code implicitly depends exclusively on both the preceding input value and the field width of the channel code for the preceding input value.

2. The method of claim 1, further comprising establishing and utilizing an escape code for each channel code field width, wherein the field width for the channel code of a particular input value is incremented by a specified amount when the input value does not fit within the field width as implicitly determined by the method of claim 1.

3. The method of claim 2, further comprising utilizing a fast field width increase mechanism to increase the field width when the channel code requires an abrupt increase in field width as an alternative to use of three or more escape codes which would otherwise be required to effect the increase in field width.

4. The method of claim 2, further comprising implementing a rule covering how repeat counts are to be encoded.

5. The method of claim 2, comprising utilizing a nonsensical code sequence to indicate a change in a parameter for compressing the digital data or a change in data type.

6. A method of compressing digital data, which has been converted into a sequence of input values, into a series of channel codes, each binary, digital channel code having an associated field width, comprising:

(a) for each particular input value, in the absence of any explicit additional channel codes or rules which specify the field width to be used for the next channel code, utilizing a digital processor to set a field width comprising a number of binary digits in the channel code and to assign a channel code, based implicitly and exclusively on (i) a current field width which is equal to the field width of the channel code immediately preceding said each particular input value; and (ii) the preceding input value;

(b) if a particular input value:
  (i) fits within the field width implicitly set in step (a), utilizing the digital processor to output the channel code in the field width;
  (ii) does not fit within the field width implicitly set in step (a), utilizing the digital processor to output an escape code and increase the field width by a first predetermined incremental value, and to repeat the output of the escape code and increase the field width until reaching a new larger final field width which is large enough to contain the channel code of the particular input value, and then outputting the channel code in the larger final field width; and (c) repeating steps (a)–(b) for each subsequent data value; and (d) transferring the series of channel codes to a storage medium or through a communications channel to a decoder.

7. The method of claim 6, wherein an input value is defined as the difference between successive input data.

8. The method of claim 7, further comprising utilizing the digital processor to implement a rule covering how repeat counts are to be encoded.

9. The method of claim 6, further comprising utilizing the digital processor to output a repeat count when an input value is identical to an immediately preceding input value.

10. The method of claim 6, further comprising utilizing the digital processor to output a repeat count when successive data are identical.

11. The method of claim 6, wherein the first incremental value is 1.

12. The method of claim 6, wherein the escape code is $2^{w-1}$ where W is the field width.

13. The method of claim 6, wherein the field width is increased by 1 when the channel code exceeds $2^{w-2}$, and is decreased by 1 when the channel code is less than $2^{w-2}$, where W is the field width.

14. A circuit, comprising processing means for compressing a sequential stream of digital input values by converting input data into input values and then into binary, digital channel codes in a plurality of fields, so that in the absence of any explicit additional channel codes or rules which specify the field width to be used for the next channel code, the field width comprising the number of binary digits in the channel code depends exclusively and implicitly on both the preceding input value and the field width of the channel code for the preceding input value.

15. An apparatus for encoding a sequential stream of digital input values, into binary, digital channel codes in a plurality of fields using a digital processor, comprising:

(a) a receiver for receiving digital input data;
(b) means for converting input data to input values;
(c) means for assigning a field width to the channel codes when encoding input values into channel codes, including means for providing that in the absence of any explicit additional channel codes or rules which specify the field width to be used for the next channel code, the field width comprising a number of binary digits in the channel code to be used for each channel code implicitly and exclusively depends both on the preceding input value and the field width of the channel code for the preceding input value; and
(d) means for transferring the channel codes to a storage medium or to a decoder.

16. The apparatus of claim 15, further comprising means for establishing and utilizing an escape code for each channel code field width, wherein the field width for the channel code of a particular input value is incremented by a specified amount when the input value does not fit within the field width assigned to the input value immediately preceding the particular input value.

17. The apparatus of claim 16, further comprising means for utilizing a fast field increase mechanism to increase the field width when the channel code requires an abrupt increase in field width which would require three or more escape codes to effect the increase in field width.

18. The apparatus of claim 15, wherein the digital data which are encoded are from a sound recording device.

19. The apparatus of claim 15, wherein the digital data which are encoded are encrypted.

20. The apparatus of claim 15, wherein the digital data which are encoded are optical image data.

* * * * *